US012598849B2

(12) United States Patent
Lee et al.

(10) Patent No.: US 12,598,849 B2
(45) Date of Patent: Apr. 7, 2026

(54) DISPLAY DEVICE AND METHOD OF MANUFACTURING THE SAME

(71) Applicant: Samsung Display Co., LTD., Yongin-si (KR)

(72) Inventors: Eok Yi Lee, Yongin-si (KR); Soo Chul Kim, Yongin-si (KR); Dae Ho Song, Yongin-si (KR); So Young Yeo, Yongin-si (KR); Ki Beom Lee, Yongin-si (KR); Sung Won Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 377 days.

(21) Appl. No.: 18/299,269

(22) Filed: Apr. 12, 2023

(65) Prior Publication Data

US 2024/0030398 A1     Jan. 25, 2024

(30) Foreign Application Priority Data

Jul. 20, 2022    (KR) ........................ 10-2022-0089495

(51) Int. Cl.
| | |
|---|---|
| *H10H 20/857* | (2025.01) |
| *H01L 25/075* | (2006.01) |
| *H01L 25/16* | (2023.01) |
| *H10D 86/01* | (2025.01) |
| *H10D 86/40* | (2025.01) |
| *H10D 86/60* | (2025.01) |
| *H10H 20/01* | (2025.01) |
| *H10H 20/832* | (2025.01) |

(Continued)

(52) U.S. Cl.
CPC ....... *H10H 20/857* (2025.01); *H01L 25/0753* (2013.01); *H01L 25/167* (2013.01); *H10D 86/0231* (2025.01); *H10D 86/441* (2025.01); *H10D 86/60* (2025.01); *H10H 20/832* (2025.01); *H10H 20/841* (2025.01); *H10H 20/8514* (2025.01); *H10H 20/032* (2025.01); *H10H 20/0361* (2025.01); *H10H 20/0364* (2025.01)

(58) Field of Classification Search
None
See application file for complete search history.

(56) References Cited

U.S. PATENT DOCUMENTS

| | | | |
|---|---|---|---|
| 10,177,127 B2 | 1/2019 | Zhang et al. | |
| 2019/0027652 A1* | 1/2019 | Jin | ..................... H10H 20/8316 |
| 2019/0324577 A1* | 10/2019 | Pan | ..................... H10D 30/6745 |

(Continued)

FOREIGN PATENT DOCUMENTS

KR    10-2018-0118488     10/2018

*Primary Examiner* — Bo B Jang
(74) *Attorney, Agent, or Firm* — CANTOR COLBURN LLP

(57) ABSTRACT

The disclosure provides a display device and a method of manufacturing the same. The display device includes a plurality of pixel circuit parts disposed on a substrate, a plurality of pixel electrodes, each disposed on the pixel circuit parts, a first insulating layer filling a space between the pixel electrodes, a plurality of light emitting elements, each disposed on the pixel electrodes, and connection electrodes disposed between the light emitting elements and the pixel electrodes. Each of the pixel electrodes includes a protrusion protruding toward a corresponding one of the connection electrodes.

14 Claims, 30 Drawing Sheets

(51) Int. Cl.
    *H10H 20/841*      (2025.01)
    *H10H 20/851*      (2025.01)

(56)                References Cited

U.S. PATENT DOCUMENTS

| | | | |
|---|---|---|---|
| 2021/0265540 A1* | 8/2021 | Itou | H10H 20/8514 |
| 2021/0273142 A1* | 9/2021 | Kang | H10D 86/60 |

* cited by examiner

10

NDA

PX PX PX
PX PX PX
PX PX PX

SDR

DPA

NDA

NDA

EXD    DIC

NDA

DR2
DR1
DR3

FIG. 6
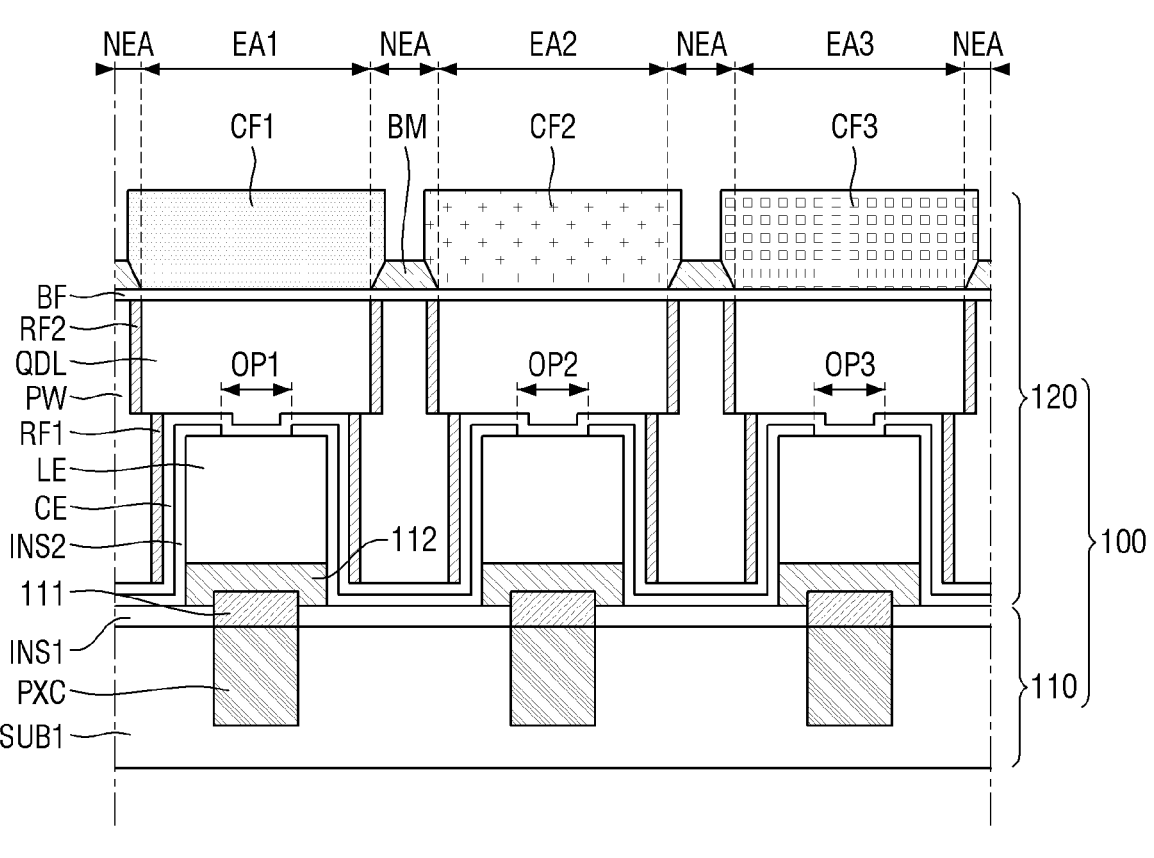
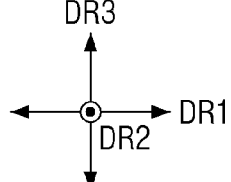
LEP : 112, LE, INS2, CE, QDL

FIG. 23

RF1
LE
CE
INS2
111
INS1
PXC
SUB1

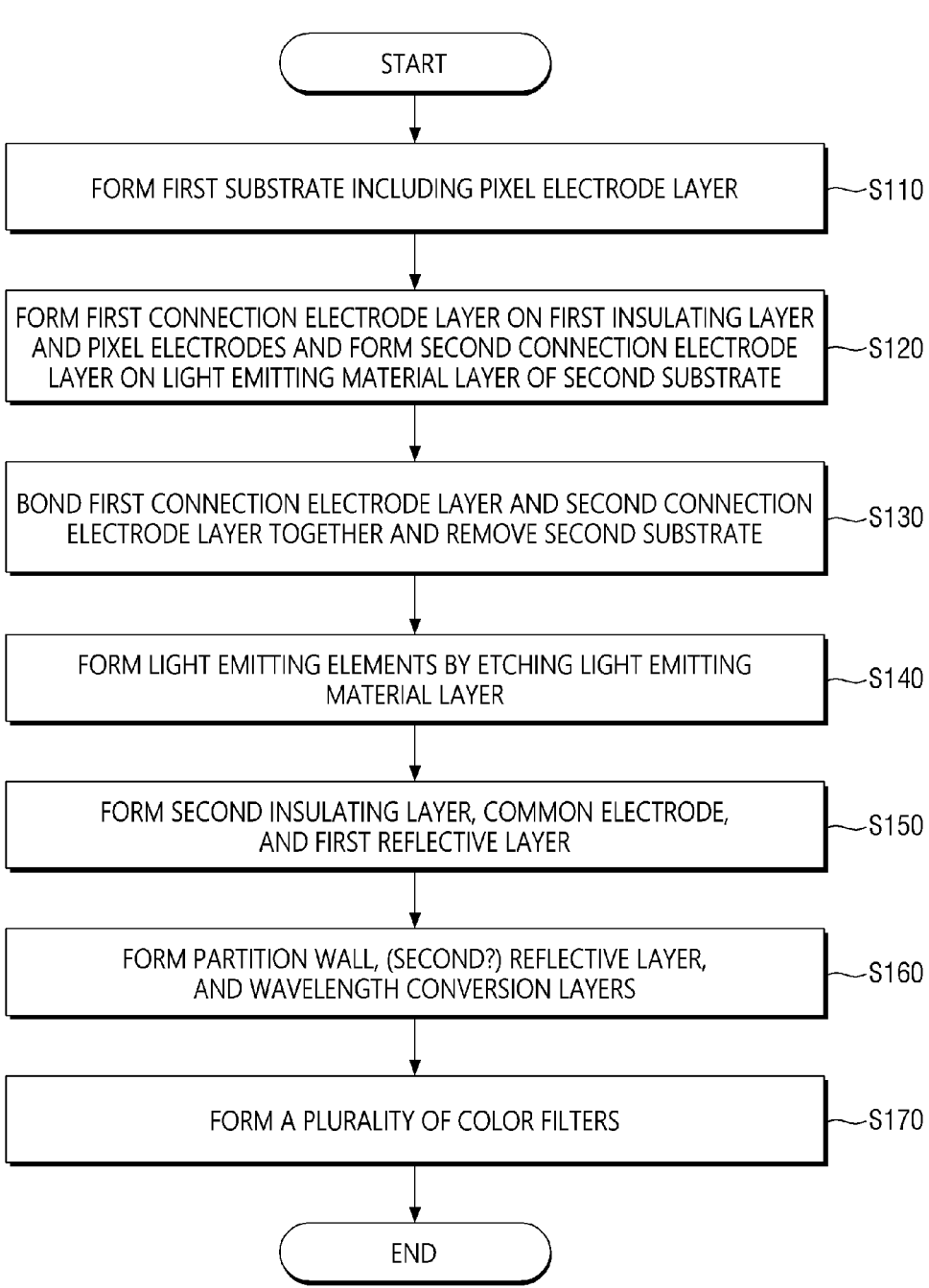

START

FORM FIRST SUBSTRATE INCLUDING PIXEL ELECTRODE LAYER — S110

FORM FIRST CONNECTION ELECTRODE LAYER ON FIRST INSULATING LAYER AND PIXEL ELECTRODES AND FORM SECOND CONNECTION ELECTRODE LAYER ON LIGHT EMITTING MATERIAL LAYER OF SECOND SUBSTRATE — S120

BOND FIRST CONNECTION ELECTRODE LAYER AND SECOND CONNECTION ELECTRODE LAYER TOGETHER AND REMOVE SECOND SUBSTRATE — S130

FORM LIGHT EMITTING ELEMENTS BY ETCHING LIGHT EMITTING MATERIAL LAYER — S140

FORM SECOND INSULATING LAYER, COMMON ELECTRODE, AND FIRST REFLECTIVE LAYER — S150

FORM PARTITION WALL, (SECOND?) REFLECTIVE LAYER, AND WAVELENGTH CONVERSION LAYERS — S160

FORM A PLURALITY OF COLOR FILTERS — S170

END

1

DISPLAY DEVICE AND METHOD OF MANUFACTURING THE SAME

CROSS REFERENCE TO RELATED APPLICATION(S)

This application claims priority to and the benefit of Korean Patent Application No. 10-2022-0089495 under 35 U.S.C. § 119, filed on Jul. 20, 2022, in the Korean Intellectual Property Office (KIPO), the entire contents of which are incorporated herein by reference.

BACKGROUND

1. Technical Field

The disclosure relates to a display device and a method of manufacturing the same.

2. Description of the Related Art

Display devices are becoming increasingly important with the development of multimedia. Accordingly, various types of display devices such as organic light emitting displays and liquid crystal displays are being used.

A display device includes a display panel such as an organic light emitting display panel or a liquid crystal display panel as a device for displaying an image of the display device. Among them, a light emitting display panel may include a light emitting element. For example, in case that the light emitting element is a light emitting diode (LED), the LED may be an organic light emitting diode (OLED) using an organic material as a light emitting material or may be an inorganic LED using an inorganic material as a light emitting material.

SUMMARY

Aspects of the disclosure provide a display device capable of preventing the generation of a void in a connection electrode connecting a light emitting element and a circuit and a method of manufacturing the display device.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a display device may include a plurality of pixel circuit parts disposed on a substrate, a plurality of pixel electrodes, each disposed on the plurality of pixel circuit parts, a first insulating layer filling a space between the plurality of pixel electrodes, a plurality of light emitting elements, each disposed on the plurality of pixel electrodes, and connection electrodes disposed between the plurality of light emitting elements and the plurality of pixel electrodes. Each of the plurality of pixel electrodes may include a protrusion protruding toward a corresponding one of the connection electrodes.

Each of the connection electrodes may cover the protrusion.

Each of the connection electrodes may include a first connection electrode covering the protrusion, and a second connection electrode electrically connected to each of the plurality of light emitting elements. The first connection electrode and the second connection electrode may be melt-bonded together.

A thickness of each of the plurality of pixel electrodes may be greater than a thickness of the first insulating layer in a thickness direction of the substrate.

Each of the plurality of pixel electrodes may include tungsten (W), copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

The first insulating layer may be an inorganic layer.

The display device may further include wavelength conversion layers, each disposed on each of the plurality of light emitting elements, and a bank filling a space between the plurality of light emitting elements and a space between the wavelength conversion layers.

The display device may further include a second insulating layer disposed on side surfaces of the plurality of light emitting elements, side surfaces of the connection electrodes, and the first insulating layer on which the plurality of light emitting elements are not disposed, and a common electrode disposed on upper surfaces of the plurality of light emitting elements and the second insulating layer.

The display device may further include a first reflective layer disposed on the side surfaces of the plurality of light emitting elements and the second insulating layer, and a second reflective layer disposed on side surfaces of the wavelength conversion layers.

A length of each of the wavelength conversion layers in a direction perpendicular to a thickness direction of the substrate may be greater than a length of each of the plurality of light emitting elements in the direction perpendicular to the thickness direction, and the display device may further include a third reflective layer disposed on bottom portions of the wavelength conversion layers not overlapping the plurality of light emitting elements.

Each of the plurality of pixel electrodes may further include a lower electrode layer and an upper electrode layer disposed on the lower electrode layer.

The lower electrode layer may include a metal oxide, and the upper electrode layer may include a metal.

The upper electrode layer may include tungsten (W), copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

The display device may further include a light blocking member disposed on the bank, and color filters, each disposed on each of the wavelength conversion layers.

Each of the plurality of light emitting elements may include a first semiconductor layer, an electron blocking layer, an active layer, a superlattice layer, and a second semiconductor layer sequentially stacked on the plurality of pixel electrodes.

According to another aspect of the disclosure, a method of manufacturing a display device may include forming a first insulating layer on pixel circuit parts disposed on a first substrate, forming contact holes on the first insulating layer exposing the pixel circuit parts by etching the first insulating layer, forming a pixel electrode layer filling the contact holes and covering the first insulating layer, forming pixel electrodes each having a protrusion protruding over the first insulating layer by etching the pixel electrode layer and the first insulating layer, forming a first connection electrode layer on the first substrate to cover the protrusion, forming a second connection electrode layer on a light emitting layer of a second substrate, bonding the first connection electrode layer and the second connection electrode layer and removing the second substrate, forming mask patterns on the light emitting layer, and forming light emitting elements and connection electrodes by etching the light emitting layer and the bonded connection electrode layers through the mask patterns.

In the forming of the pixel electrodes, the pixel electrode layer may be etched by a chemical mechanical method using a first slurry until the first insulating layer is exposed, and the first insulating layer may be selectively etched by the chemical mechanical method using a second slurry until a thickness of the first insulating layer is less than a thickness of the pixel electrode layer in a thickness direction of the first substrate.

The pixel electrode layer may be formed of tungsten (W), copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof, the first insulating layer may be formed of an inorganic material, the first slurry may be a first abrasive for selectively polishing a metal, and the second slurry may be a second abrasive for selectively polishing an inorganic material.

The method may further include forming a second insulating layer on upper surfaces and side surfaces of the light emitting elements, side surfaces of the connection electrodes, and the first insulating layer on which the light emitting elements are not disposed, forming openings on the second insulating layer that partially expose the upper surfaces of the light emitting elements by etching a portion of the second insulating layer on the upper surfaces of the light emitting elements, forming a common electrode on the second insulating layer and in the openings of the second insulating layer, forming a bank by applying an organic insulating material on the light emitting elements and patterning the organic insulating material, and forming wavelength conversion layers on the common electrode between portions of the bank to convert wavelengths of light emitted from the light emitting elements.

The method may further include forming a light blocking member on the bank, and placing color filters on the wavelength conversion layers.

In a display device and a method of manufacturing the same according to embodiments, it is possible to prevent a decrease in the current density of the display device by preventing the generation of a void in a connection electrode.

Therefore, a decrease in the luminance of the display device can be reduced. However, the effects of the disclosure are not limited to the aforementioned effects, and various other effects are included in the specification.

BRIEF DESCRIPTION OF THE DRAWINGS

These and/or other aspects will become apparent and more readily appreciated from the following description of the embodiments, taken in conjunction with the accompanying drawings in which.

4

Figure 7:
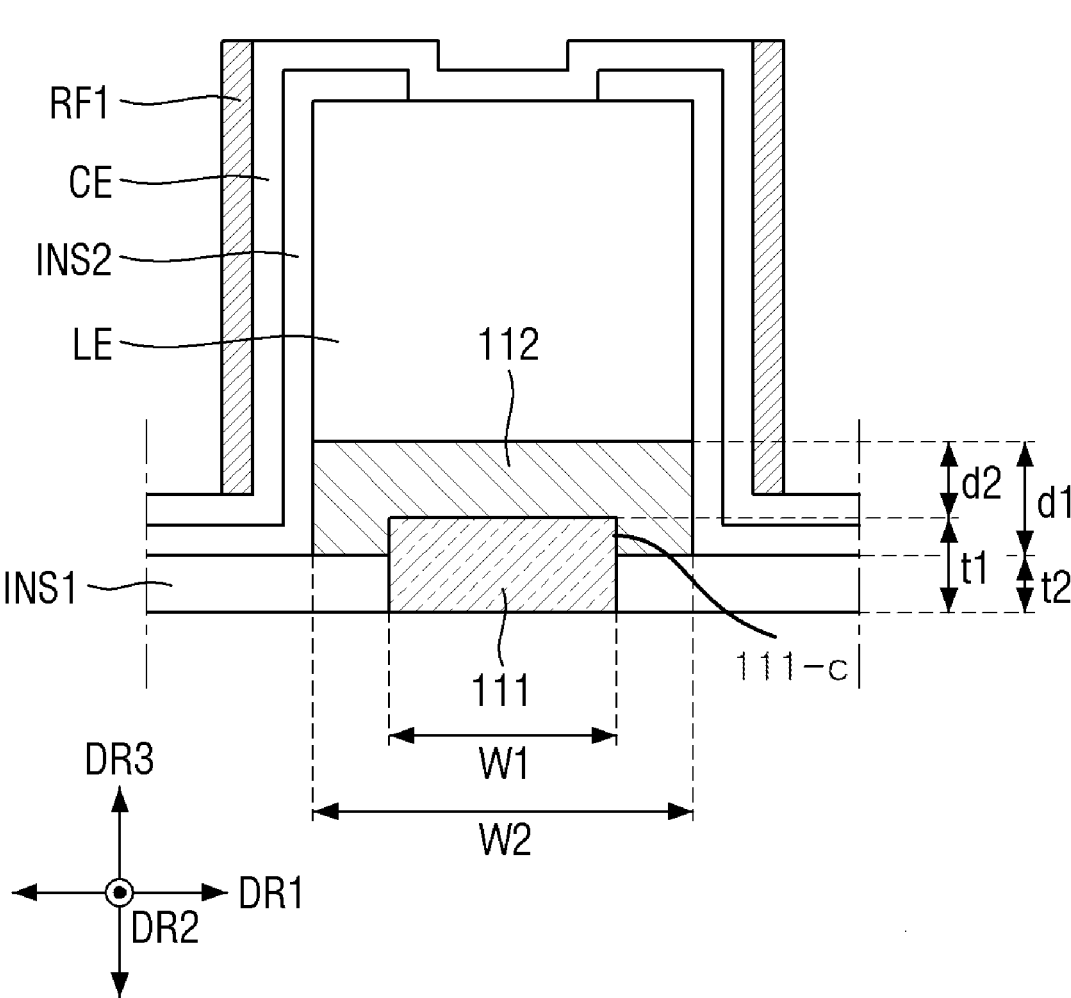
Figure 8:
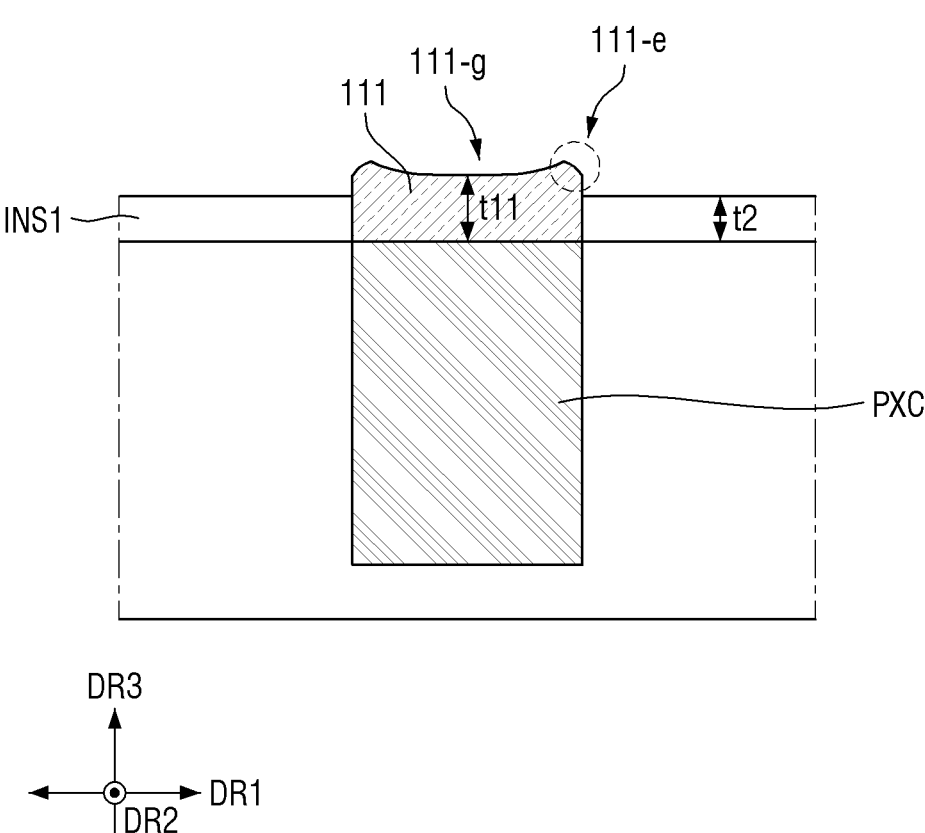
Figure 9:
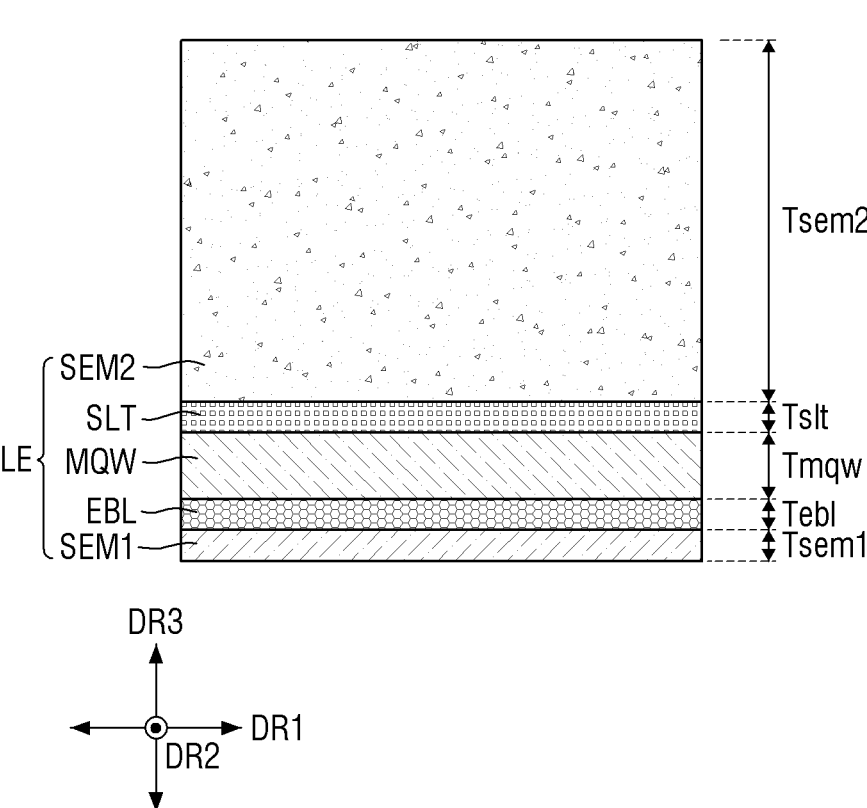
Figure 10:
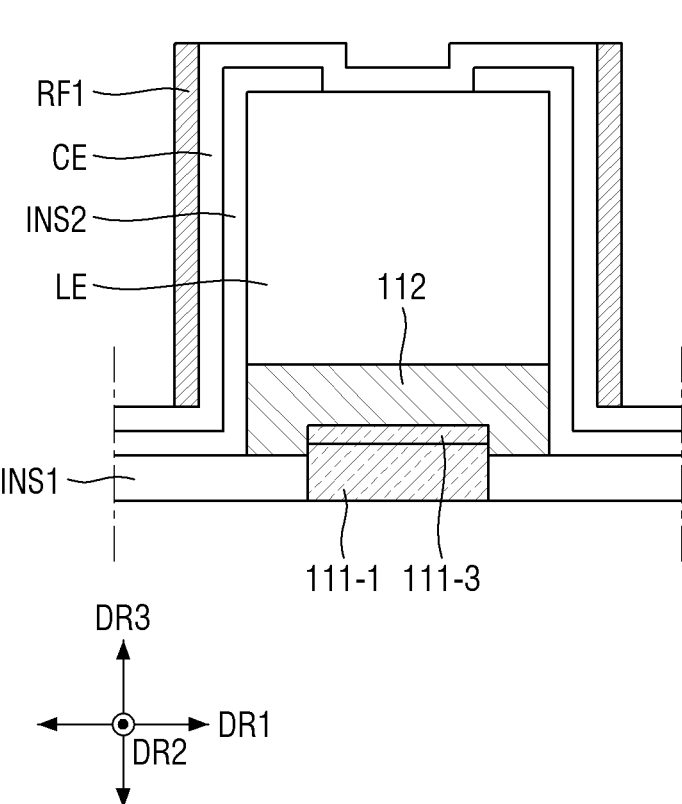
Figure 11:
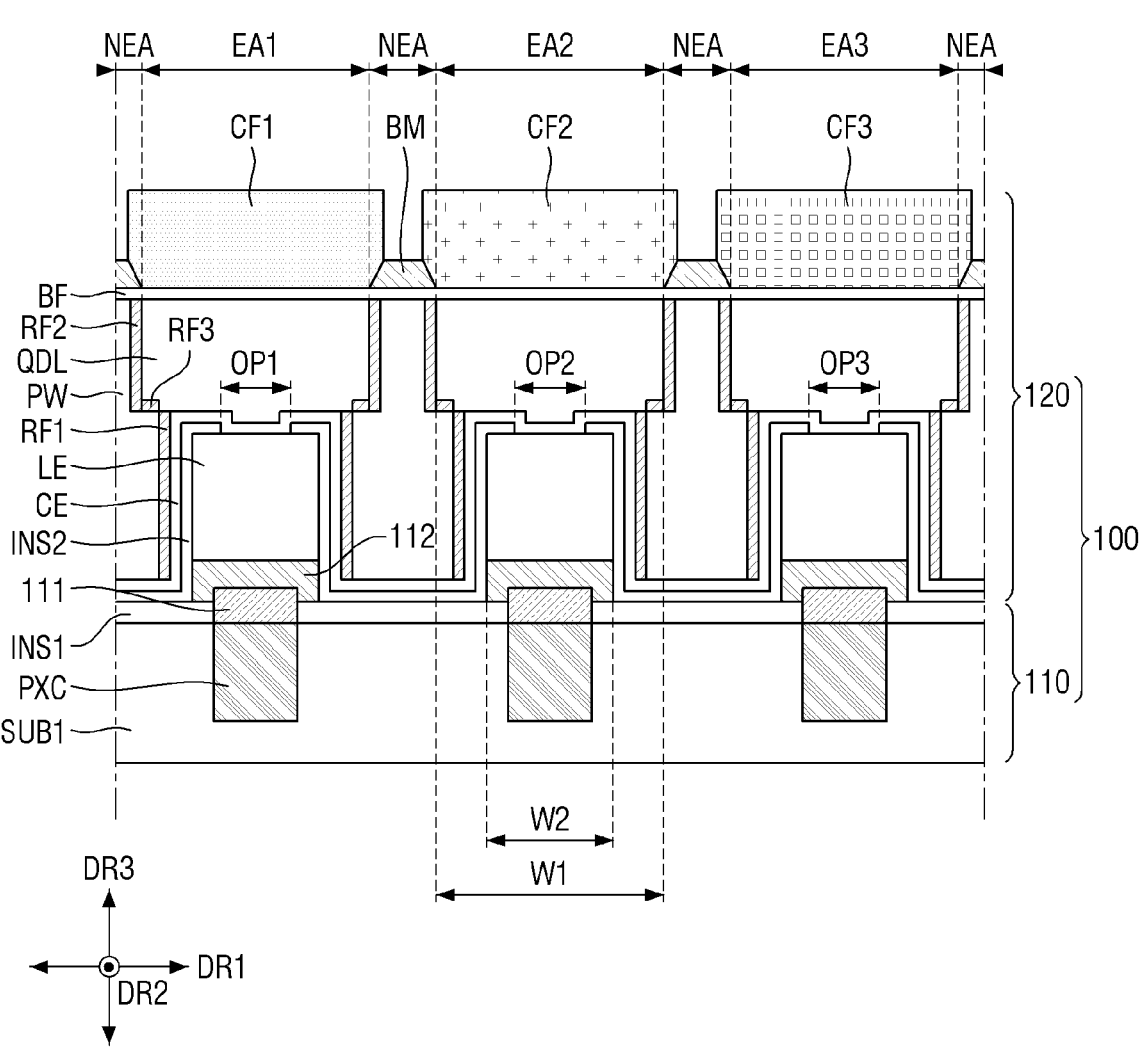
Figure 12:
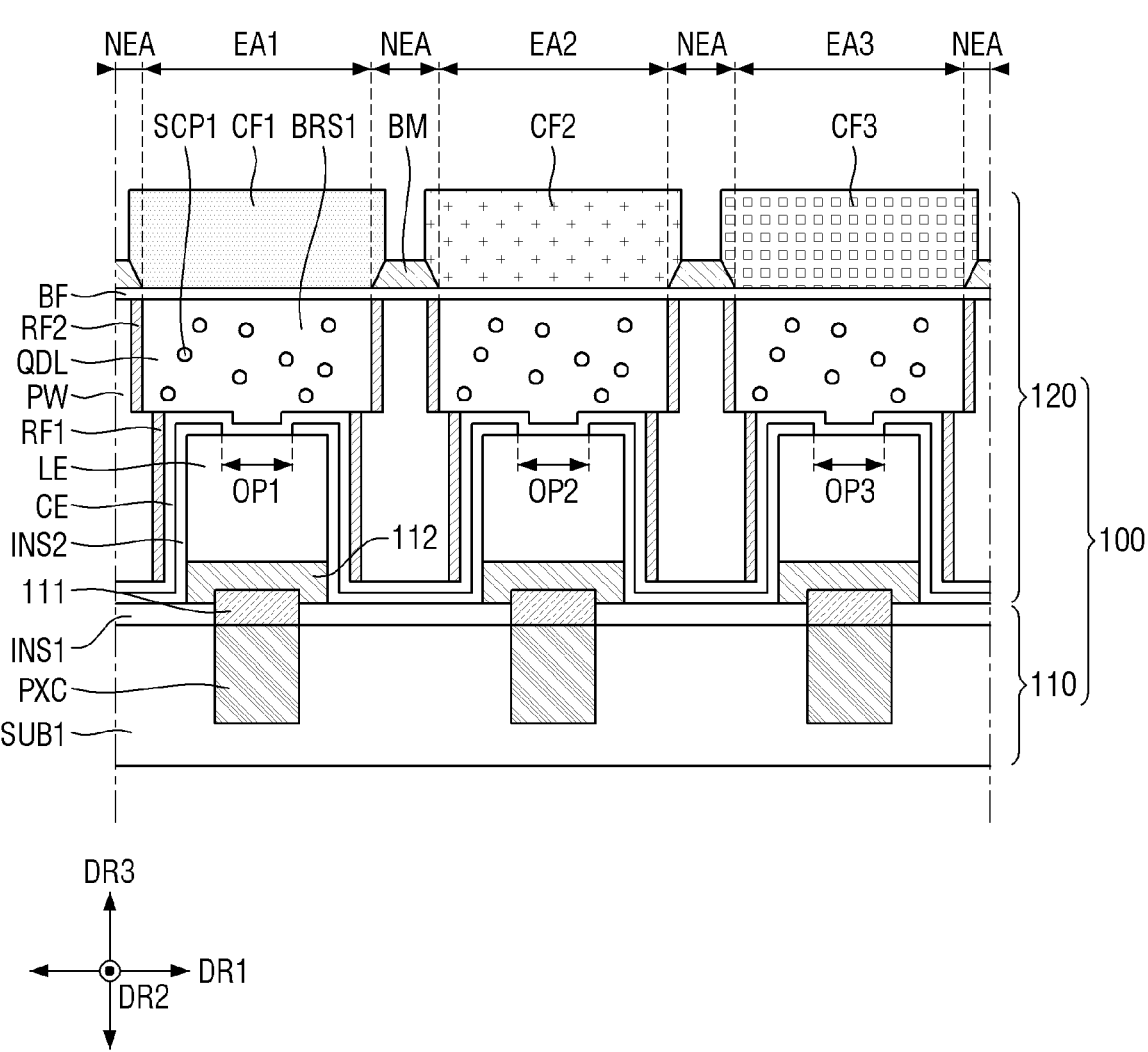
Figure 13:
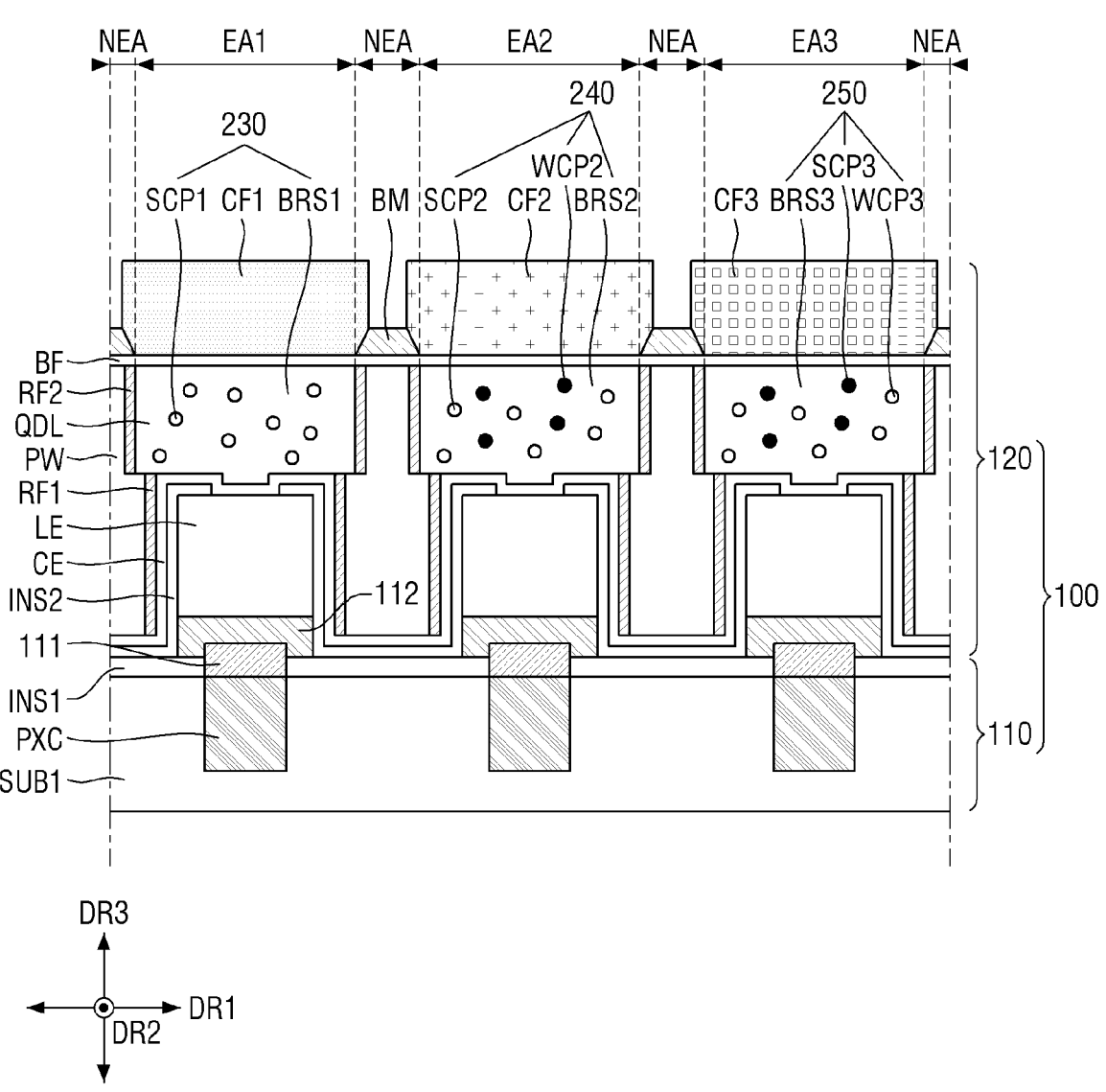
Figure 29:
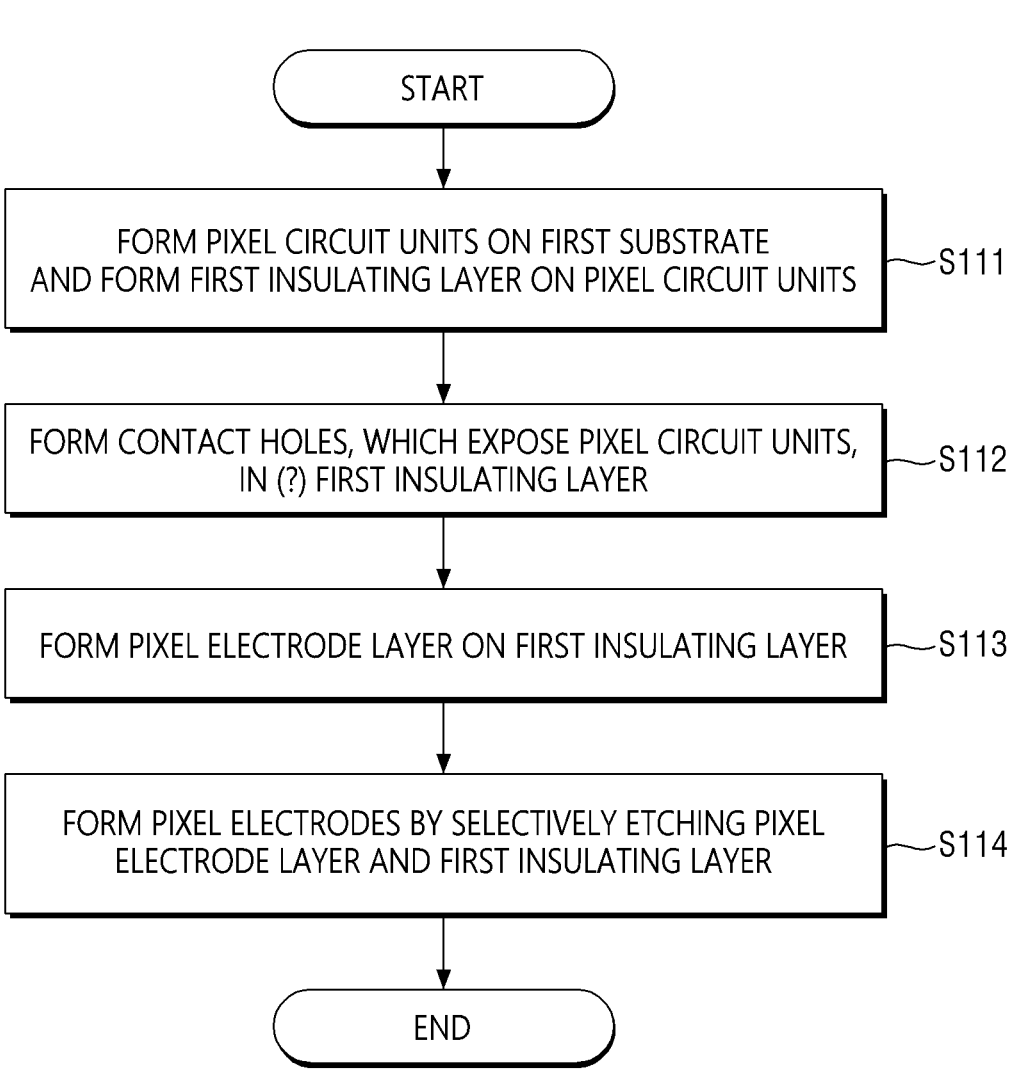
Figure 30:
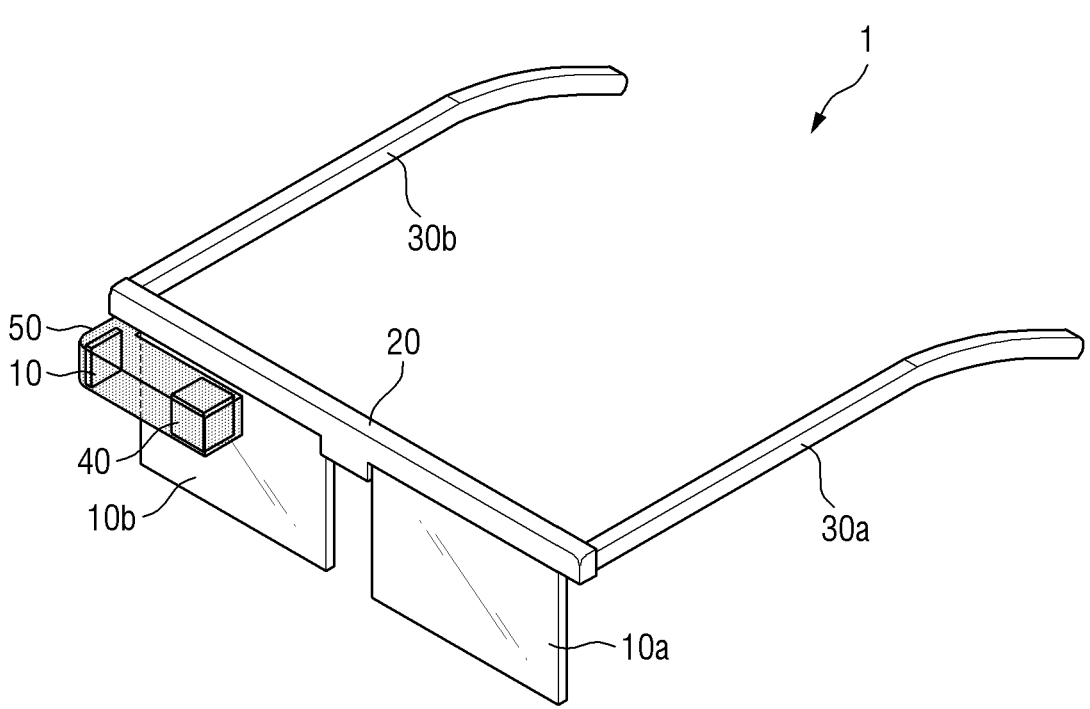
Figure 31:
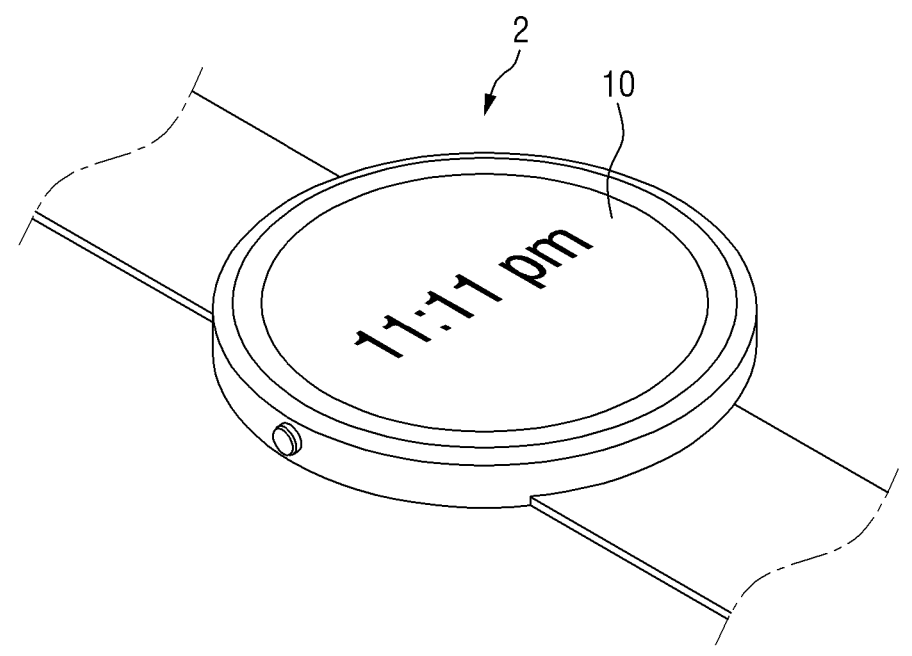
Figure 32:
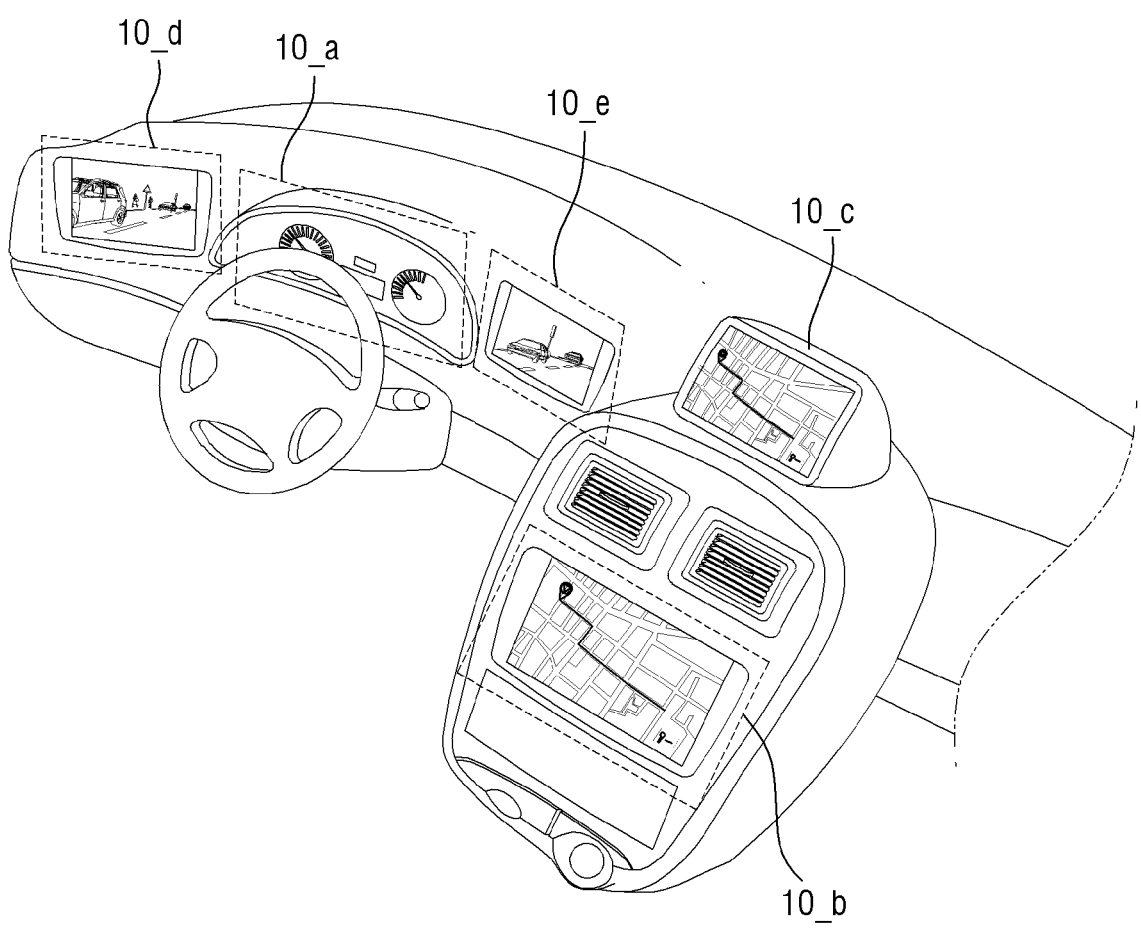
Figure 33:
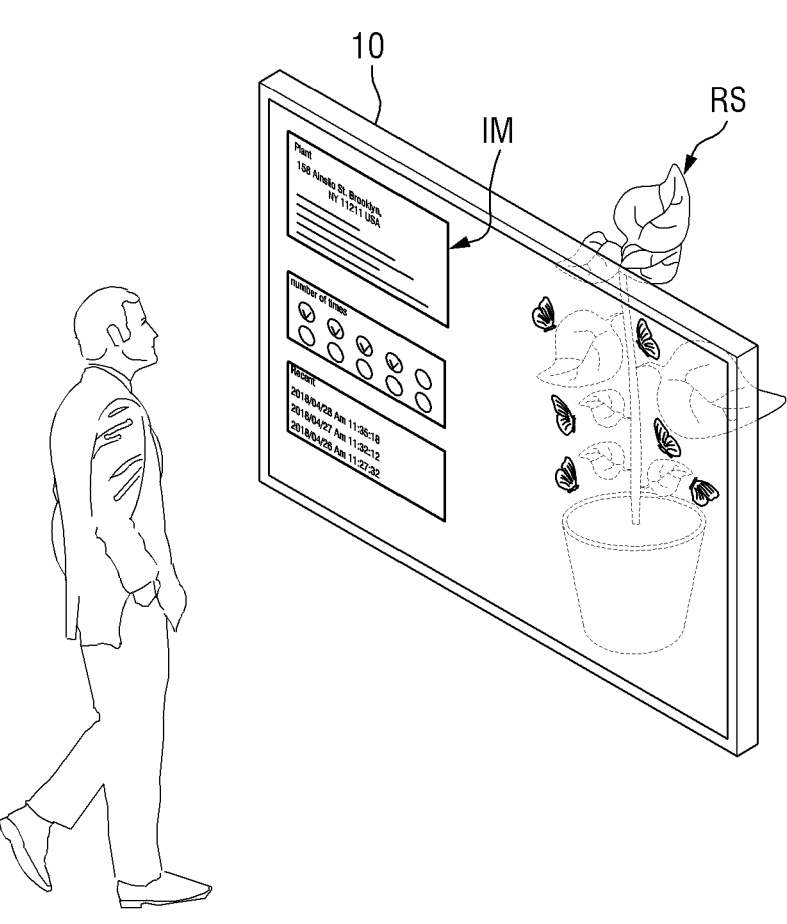

FIG. 6 is a schematic cross-sectional view of a display device according to an embodiment;

FIG. 7 is a schematic cross-sectional view illustrating a pixel electrode and a light emitting element according to an embodiment;

FIG. 8 is a schematic cross-sectional view illustrating a pixel electrode and an insulating layer;

FIG. 9 is a schematic cross-sectional view illustrating a light emitting element of FIG. 6 according to an embodiment;

FIG. 10 is a schematic cross-sectional view illustrating a pixel electrode and a light emitting element according to an embodiment;

FIG. 11 is a schematic cross-sectional view of a display device according to an embodiment;

FIG. 12 is a schematic cross-sectional view of a display device according to an embodiment;

FIG. 13 is a schematic cross-sectional view of a display device according to an embodiment;

FIGS. 14 through 27 are schematic cross-sectional views illustrating a method of manufacturing a display device according to an embodiment;

FIG. 28 is a flowchart illustrating the method of manufacturing the display device according to the embodiment;

FIG. 29 is a flowchart illustrating a method of manufacturing a semiconductor circuit board according to an embodiment;

FIG. 30 is a schematic diagram showing a virtual reality device including a display device according to an embodiment;

FIG. 31 is a schematic diagram showing a smart device including a display device according to an embodiment;

FIG. 32 is a schematic diagram showing a vehicle including a display device according to an embodiment; and FIG. 33 is a schematic diagram showing a transparent display device including a display device according to an embodiment.

DETAILED DESCRIPTION OF THE EMBODIMENTS

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may have been omitted in order to clearly describe embodiments of the disclosure.

It will be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1:
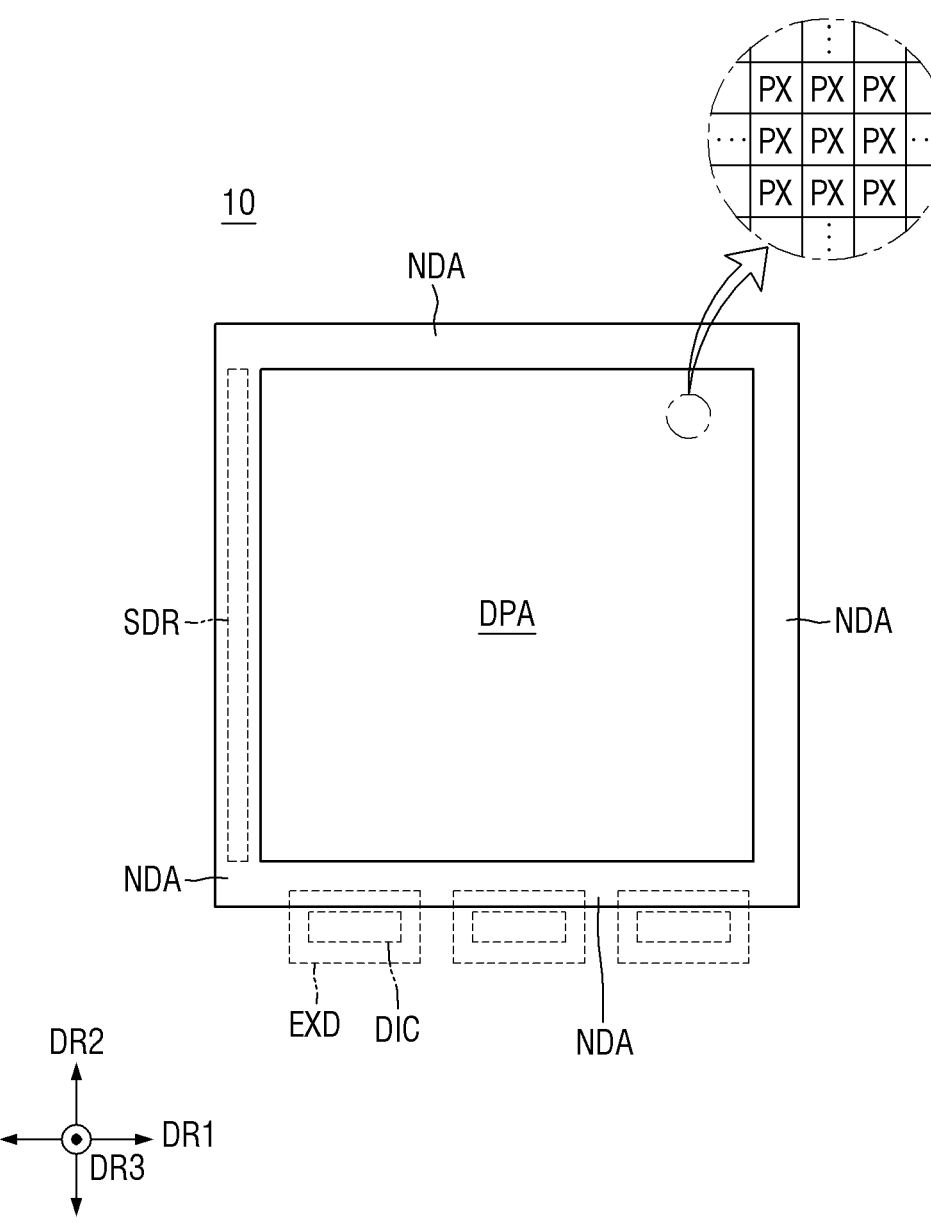
FIG. 1 is a plan view of a display device according to an embodiment.

FIG. 1 is a plan view of a display device 10 according to an embodiment.

Referring to FIG. 1, the display device 10 according to the embodiment may be applied to smartphones, mobile phones, tablet personal computers (PCs), personal digital assistants (PDAs), portable multimedia players (PMPs), televisions, game consoles, wristwatch-type electronic devices, head mounted displays, monitors of PCs, laptop computers, car navigation systems, car dashboards, digital cameras, camcorders, outdoor billboards, electronic display boards, medical devices, examination devices, various home appliances such as refrigerators and washing machines, or Internet of things (IoT) devices. In the specification, a television will be described as an example of a display device, and the television may have high resolution or ultra-high resolution such as HD, UHD, 4K, and 8K.

The display device 10 according to the embodiment may be variously classified according to a display method. For example, the display device may be classified as an organic light emitting display device, an inorganic electroluminescent (EL) display device, a quantum dot light emitting display device (QED), a micro-light emitting diode display device, a nano-light emitting diode display device, a plasma display panel (PDP), a field emission display (FED) device, a cathode ray tube (CRT) display device, a liquid crystal display (LCD) device, or an electrophoretic display (EPD) device. An organic light emitting display device will be described below as an example of a display device. Unless a special distinction is required, the organic light emitting display device applied to embodiments will be simply abbreviated as a display device. However, the embodiments are not limited to the organic light emitting display device, and other display devices listed above or known in the art can also be applied within the scope sharing the technical spirit.

In the following drawings, a first direction DR1 indicates a horizontal direction of the display device 10, a second direction DR2 indicates a vertical direction of the display device 10, and a third direction DR3 indicates a thickness direction of the display device 10. "Left," "right," "upper," and "lower" refer to directions in case that the display device 10 is seen in a plan view. For example, a "right side" refers to a side in the first direction DR1, a "left side" refers to another side in the first direction DR1, an "upper side" refers to a side in the second direction DR2, and a "lower side" refers to another side in the second direction DR2. In addition, "top" refers to a side in the third direction DR3, and "bottom" refers to another side in the third direction DR3.

The display device 10 according to the embodiment may have a quadrate shape in a plan view, for example, a square shape. In case that the display device 10 is a television, it may have a rectangular shape with long sides located in the horizontal direction. However, the disclosure is not limited thereto, and the long sides may be located in the vertical direction, or the display device 10 may be rotatably installed so that the long sides can be variably located in the horizontal or vertical direction. The display device 10 may have a circular or elliptical shape in a plan view.

The display device 10 may include a display area DPA and a non-display area NDA. The display area DPA may be an active area in which an image is displayed. The display area DPA may have a square shape similar to the overall shape of the display device 10 in a plan view, but the disclosure is not limited thereto.

The display area DPA may include multiple pixels PX. The pixels PX may be arranged in matrix. Each of the pixels PX may have a rectangular shape or a square shape in a plan view. However, the disclosure is not limited thereto, and each of the pixels PX may have a rhombic planar shape having each side inclined with respect to a side of the display device 10. The pixels PX may include multiple color pixels PX. For example, the pixels PX may include, but are not limited to, a red first color pixel PX, a green second color pixel PX, and a blue third color pixel PX. The color pixels PX may be alternately arranged in a stripe or PenTile® pattern.

The non-display area NDA may be located adjacent to the display area DPA. The non-display area NDA may entirely or partially surround the display area DPA. The display area DPA may be square, and the non-display area NDA may be disposed adjacent to four sides of the display area DPA. The non-display area NDA may form a bezel of the display device 10.

A driving circuit or a driving element for driving the display area DPA may be disposed in the non-display area NDA. In an embodiment, a pad portion may be provided on a display substrate of the display device 10 in the non-display area NDA disposed adjacent to a first side (a lower side in FIG. 1) of the display device 10, and external devices EXD may be mounted on pad electrodes of the pad portion. Examples of the external devices EXD may include a connection film, a printed circuit board, a driving chip (DIC), a connector, and a wiring connection film. A scan driver SDR formed directly on the display substrate of the display device 10 may be disposed in the non-display area NDA adjacent to a second side (a left side in FIG. 1) of the display device 10.

Figure 2:
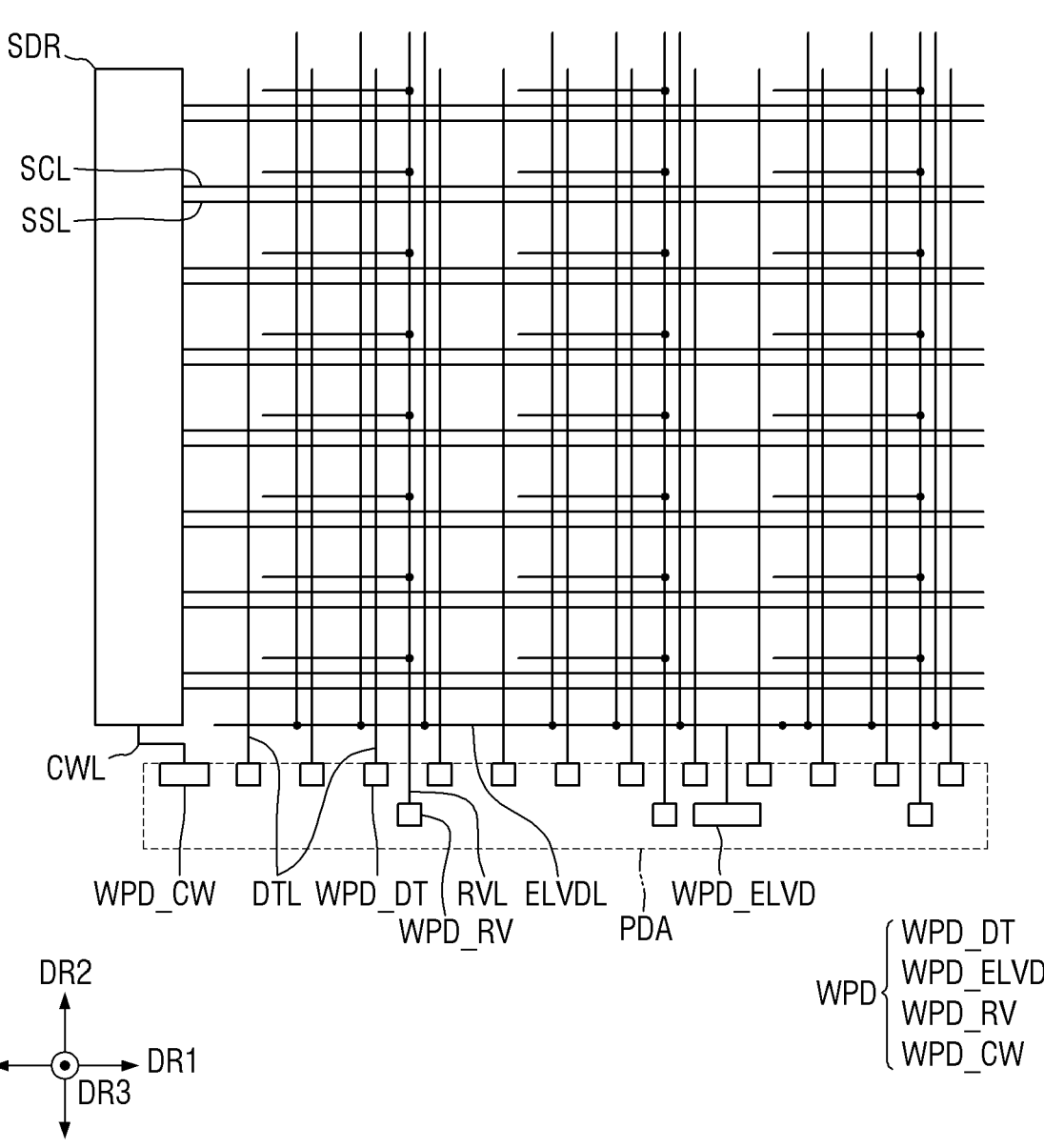
FIG. 2 is a schematic layout view of a circuit of a display substrate of the display device according to the embodiment.

FIG. 2 is a schematic layout view of a circuit of the display substrate of the display device 10 according to the embodiment.

Referring to FIG. 2, multiple wirings may be disposed on a first substrate. The wirings may include scan lines SCL, sensing signal lines SSL, data lines DTL, reference voltage lines RVL, and a first power line ELVDL.

The scan lines SCL and the sensing signal lines SSL may extend in the first direction DR1. The scan lines SCL and the sensing signal lines SSL may be connected to the scan driver SDR. The scan driver SDR may include a driving circuit. The scan driver SDR may be disposed on a side of the non-display area NDA on the display substrate. However, the disclosure is not limited thereto, and the scan driver SDR may be disposed on both sides of the non-display area NDA. The scan driver SDR may be connected to a signal connection wiring CWL, and at least one end of the signal connection wiring CWL may form a pad WPD_CW in a first non-display area NDA and/or a second non-display area NDA and thus may be connected to an external device EXD (see FIG. 1).

The data lines DTL and the reference voltage lines RVL may extend in the second direction DR2 intersecting the first direction DR1. The first power line ELVDL may include portions extending in the second direction DR2. The first power line ELVDL may also include a portion extending in the first direction DR1. The first power line ELVDL may have a mesh structure, but the disclosure is not limited thereto.

A wiring pad WPD may be disposed on an end of at least one of the data lines DTL, the reference voltage lines RVL, and the first power line ELVDL. Each wiring pad WPD may be disposed in a pad portion PDA of the non-display area NDA. In an embodiment, wiring pads WPD_DT (hereinafter, referred to as 'data pads') of the data lines DTL, wiring pads WPD_RV (hereinafter, referred to as 'reference voltage pads') of the reference voltage lines RVL, and a wiring pad WPD_ELVD (hereinafter, referred to as a 'first power pad') of the first power line ELVDL may be disposed in the pad portion PDA of the non-display area NDA. In another embodiment, the data pads WPD_DT, the reference voltage pads WPD_RV, and the first power pad WPD_ELVD may be disposed in another non-display area NDA. As described above, the external devices EXD (see FIG. 1) may be mounted on the wiring pads WPD. The external devices EXD may be mounted on the wiring pads WPD through an anisotropic conductive film, ultrasonic bonding, or the like.

Each pixel PX on the display substrate may include a pixel driving circuit. The above-described wirings may transmit driving signals to each pixel driving circuit while passing through or around each pixel PX. The pixel driving circuit may include a transistor and a capacitor. The number of transistors and capacitors in each pixel driving circuit can be variously changed. Although the pixel driving circuit will be described below using a 3T1C structure including three transistors and one capacitor as an example, the disclosure is not limited thereto, and other various modified structures such as a 2T1C structure, a 7T1C structure, and a 6T1C structure may be also applicable.

Figure 3:
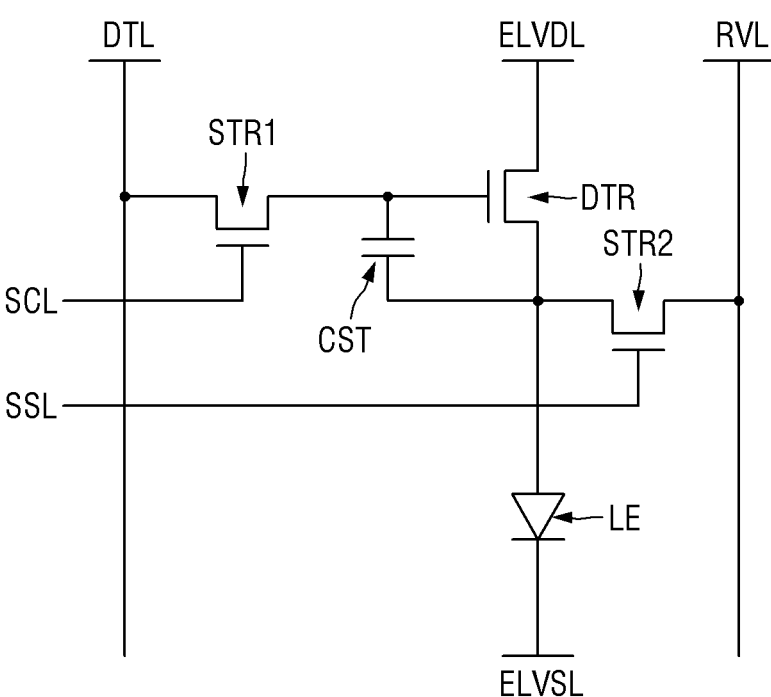
FIG. 3 is a schematic diagram of an equivalent circuit of a pixel of the display device according to the embodiment.

FIG. 3 is a schematic diagram of an equivalent circuit of a pixel PX of the display device 10 according to the embodiment.

Referring to FIG. 3, each pixel PX of the display device 10 according to the embodiment may include three transistors DTR, STR1, and STR2 and one storage capacitor CST in addition to a light emitting element LE.

The light emitting element LE may emit light in response to a current supplied through a driving transistor DTR. The light emitting element LE may be an inorganic light emitting diode, an organic light emitting diode, a micro-light emitting diode, or a nano-light emitting diode.

A first electrode (i.e., an anode) of the light emitting element LE may be connected to a source electrode of the driving transistor DTR, and a second electrode (i.e., a cathode) may be connected to a second power line ELVSL to which a low potential voltage (a second power supply voltage) lower than a high potential voltage (a first power supply voltage) of a first power line ELVDL is supplied.

The driving transistor DTR may adjust a current flowing from the first power line ELVDL, to which the first power supply voltage is supplied, to the light emitting element EL according to a voltage applied to a gate electrode. The driving transistor DTR may have the gate electrode connected to a first electrode of a first transistor STR1, the source electrode connected to the first electrode of the light emitting element EL, and a drain electrode connected to the first power line ELVDL to which the first power supply voltage is applied.

The first transistor STR1 may be turned on by a scan signal of a scan line SCL to connect a data line DTL to the gate electrode of the driving transistor DTR. The first transistor STR1 may have a gate electrode connected to the scan line SCL, the first electrode connected to the gate electrode of the driving transistor DTR, and a second electrode connected to the data line DTL.

A second transistor STR2 may be turned on by a sensing signal of a sensing signal line SSL to connect a reference voltage line RVL to the source electrode of the driving transistor DTR. The second transistor STR2 may have a gate electrode connected to the sensing signal line SSL, a first electrode connected to the reference voltage line RVL, and a second electrode connected to the source electrode of the driving transistor DTR.

In an embodiment, the first electrode of each of the first and second transistors STR1 and STR2 may be a source electrode, and the second electrode may be a drain electrode. However, the disclosure is not limited thereto, and the first electrode may be a drain electrode and the second electrode may be a source electrode.

The storage capacitor CST may be formed between the gate electrode and the source electrode of the driving transistor DTR. The storage capacitor CST may store a voltage difference between a gate voltage and a source voltage of the driving transistor DTR.

Each of the driving transistor DTR and the first and second transistors STR1 and STR2 may be formed as a thin-film transistor. Although a case where the driving transistor DTR and the first and second switching transistors STR1 and STR2 are N-type metal oxide semiconductor field effect transistors (MOSFETs) has been described in FIG. 3, the disclosure is not limited thereto. For example, the driving transistor DTR and the first and second transistors STR1 and STR2 may be formed as P-type MOSFETs, or some of them may be formed as N-type MOSFETs, and others of them may be formed as a P-type MOSFET.

Figure 4:
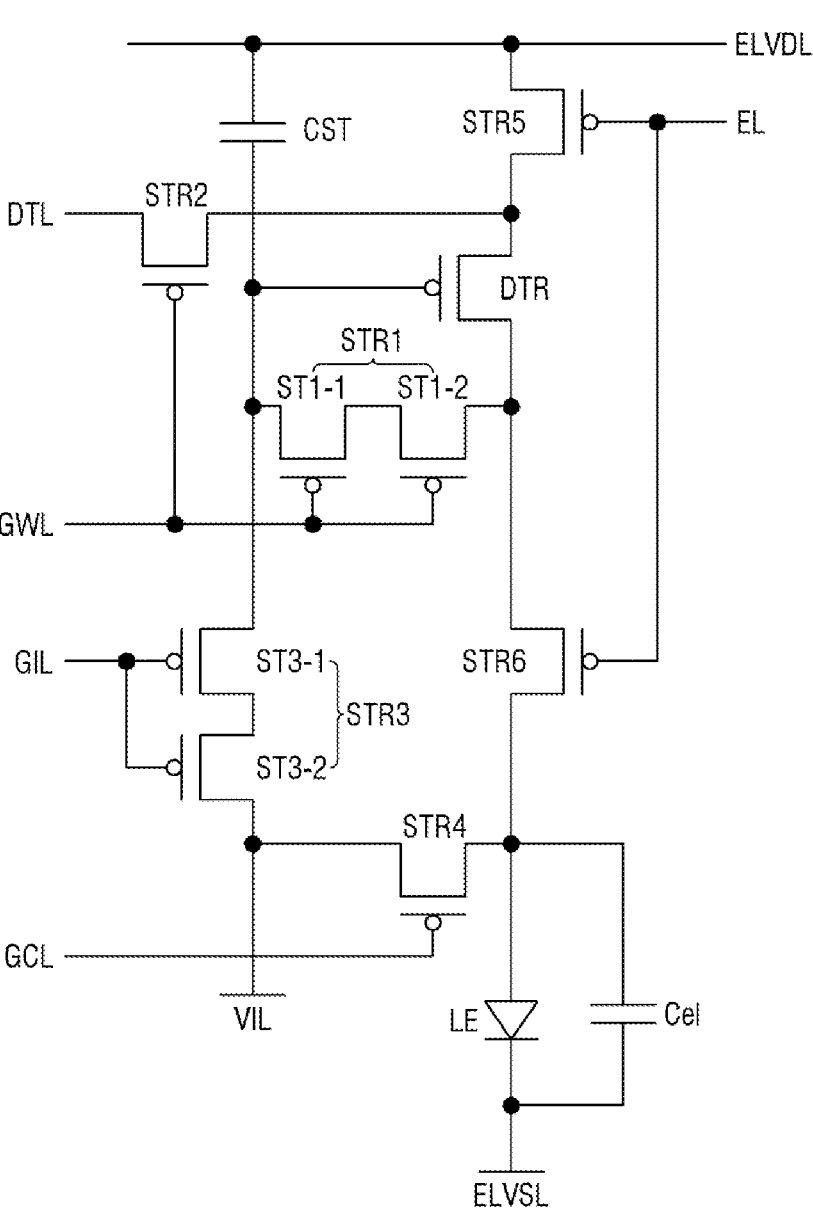
FIG. 4 is a schematic diagram of an equivalent circuit of a pixel of a display device according to an embodiment.

FIG. 4 is a schematic diagram of an equivalent circuit of a pixel PX of a display device according to an embodiment.

Referring to FIG. 4, a first electrode of a light emitting element LE may be connected to a first electrode of a fourth transistor STR4 and a second electrode of a sixth transistor STR6, and a second electrode of the light emitting element LE may be connected to a second power line ELVSL. A parasitic capacitance Ce1 may be formed between the first electrode and the second electrode of the light emitting element LE.

Each pixel PX may include a driving transistor DTR, switch elements, and a capacitor CST. The switch elements may include first through sixth transistors STR1 through STR6.

The driving transistor DTR may include a gate electrode, a first electrode, and a second electrode. The driving transistor DTR may control a drain-source current (hereinafter, referred to as a "driving current") flowing between the first electrode and the second electrode according to a data voltage applied to the gate electrode.

The capacitor CST may be formed between the gate electrode of the driving transistor DTR and the second power line ELVSL. An electrode of the capacitor CST may be connected to the second electrode of the driving transistor DTR, and another electrode may be connected to the second power line ELVSL.

In case that a first electrode of each of the first through sixth transistors STR1 through STR6 and the driving transistor DTR is a source electrode, a second electrode may be a drain electrode. In case that the first electrode of each of the first through sixth transistors STR1 through STR6 and the driving transistor DTR is a drain electrode, the second electrode may be a source electrode.

A semiconductor layer of each of the first through sixth transistors STR1 through STR6 and the driving transistor DTR may be made of one of polysilicon, amorphous silicon, and an oxide semiconductor. In case that a semiconductor layer of each of the first through sixth transistors STR1 through STR6 and the driving transistor DTR is made of polysilicon, a process for forming the semiconductor layer may be a low-temperature polysilicon (LTPS) process.

Although a case where the first through sixth transistors STR1 through STR6 and the driving transistor DTR are formed as P-type MOSFETs has been described in FIG. 4, the disclosure is not limited thereto, and the first through sixth transistors STR1 through STR6 and the driving transistor DTR may be formed as N-type MOSFETs.

A first power supply voltage of a first power line ELVDL, a second power supply voltage of the second power line ELVSL, and a third power supply voltage of a third power line VIL may be set in consideration of characteristics of the driving transistor DTR, characteristics of the light emitting element LE, etc.

Figure 5:
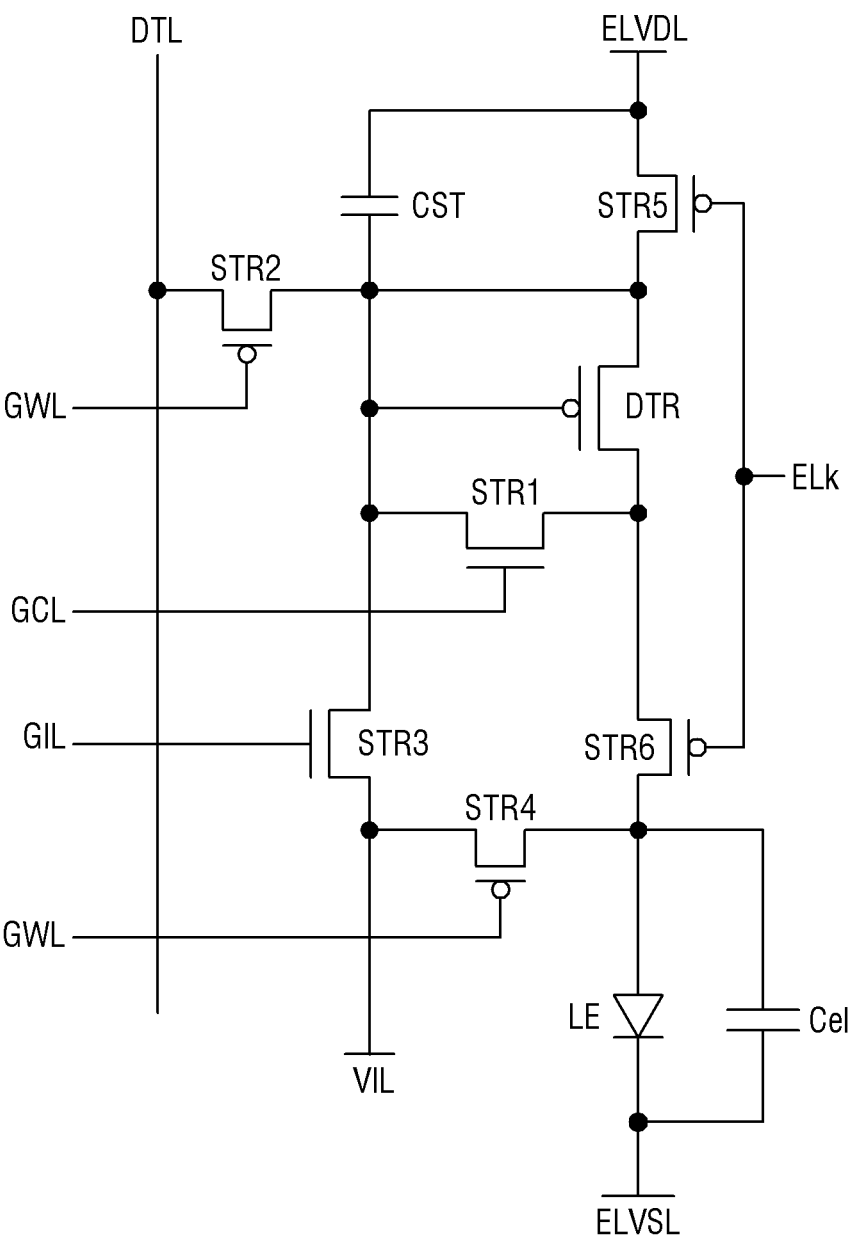
FIG. 5 is a schematic diagram of an equivalent circuit of a pixel of a display device according to an embodiment.

FIG. 5 is a schematic diagram of an equivalent circuit of a pixel of a display device according to an embodiment.

The embodiment of FIG. 5 is different from the embodiment of FIG. 4 in that a driving transistor DTR, a second transistor STR2, a fourth transistor STR4, a fifth transistor STR5, and a sixth transistor STR6 are formed as P-type MOSFETs, and a first transistor STR1 and a third transistor STR3 are formed as N-type MOSFETs.

Referring to FIG. 5, an active layer of each of the driving transistor DTR, the second transistor STR2, the fourth transistor STR4, the fifth transistor STR5 and the sixth transistor STR6 formed as P-type MOSFETs may be made of polysilicon, and an active layer of each of the first transistor STR1 and the third transistor STR3 formed as N-type MOSFETs may be made of an oxide semiconductor.

The embodiment of FIG. 5 is different from the embodiment of FIG. 4 in that a gate electrode of the second transistor STR2 and a gate electrode of the fourth transistor STR4 are each connected to a write scan wiring GWL, and a gate electrode of the first transistor ST1 is connected to a control scan wiring GCL. Since the first transistor STR1 and the third transistor STR3 are formed as N-type MOSFETs in FIG. 5, a scan signal of a gate high voltage may be transmitted to the control scan wiring GCL and an initialization scan wiring GIL. In contrast, since the second transistor STR2, the fourth transistor STR4, the fifth transistor STR5, and the sixth transistor STR6 are formed as P-type MOSFETs, a scan signal of a gate low voltage may be transmitted to the write scan wiring GWL and an emission wiring ELk.

However, it should be noted that the circuit of the pixel is not limited to those illustrated in FIGS. 3 through 5. The circuit of the pixel may also be formed in other circuit structures that those skilled in the art can employ in addition to the embodiments illustrated in FIGS. 3 through 5.

FIG. 6 is a schematic cross-sectional view of a display device 100 according to an embodiment. FIG. 7 is a schematic cross-sectional view illustrating a pixel electrode 111 and a light emitting element LE according to an embodiment. FIG. 8 is a schematic cross-sectional view illustrating a pixel electrode 111 and an insulating layer. FIG. 9 is a schematic cross-sectional view illustrating a light emitting element LE of FIG. 6 according to an embodiment.

Referring to FIGS. 6 through 9, the display device 100 may include a semiconductor circuit board 110 and a light emitting layer 120.

The semiconductor circuit board 110 may include a first substrate SUB1, multiple pixel circuit parts PXC, pixel electrodes 111, and a first insulating layer INS1.

The first substrate SUB1 may be an insulating substrate. The first substrate SUB1 may include a transparent material. For example, the first substrate SUB1 may include a transparent insulating material such as glass or quartz. The first substrate SUB1 may be a rigid substrate. However, the first substrate SUB1 is not limited to the rigid substrate. The first substrate SUB1 may include plastic such as polyimide and have flexible characteristics so that it can be curved, bent, folded, or rolled. Multiple emission areas EA1 through EA3 and a non-emission area NEA may be defined in the first substrate SUB1.

Each of the pixel circuit parts PXC may be disposed on the first substrate SUB1. Each of the pixel circuit parts PXC may include a complementary metal-oxide semiconductor (CMOS) circuit formed using a semiconductor process. Each of the pixel circuit parts PXC may include at least one transistor formed by a semiconductor process. Each of the pixel circuit parts PXC may further include at least one capacitor formed by a semiconductor process.

The pixel circuit parts PXC may be disposed in a display area DPA. Each of the pixel circuit parts PXC may be connected to a corresponding pixel electrode 111. For example, the pixel circuit parts PXC and the pixel electrodes 111 may be connected one-to-one to each other. Each of the pixel circuit parts PXC may apply a pixel voltage or an anode voltage to a pixel electrode 111.

Each of the pixel electrodes 111 may be disposed on a corresponding pixel circuit unit PXC. Each of the pixel electrodes 111 may be an electrode exposed from the pixel circuit unit PXC. Each of the pixel electrodes 111 may protrude from an upper surface of the pixel circuit unit PXC. Each of the pixel electrodes 111 may include a protrusion 111-c protruding toward a light emitting element LE which will be described below. Each of the pixel electrodes 111 may be formed to protrude toward a connection electrode 112 which will be described below, and the connection electrode 112 may be formed to cover the protrusion 111-c of the pixel electrode 111. The connection electrode 112 may have a thickness d1 two or more times greater than a height of the protrusion 111-c to sufficiently cover the protrusion 111-c. For example, a thickness d2 of the connection electrode 112 excluding the protrusion 111-c may be half or more of the total thickness d1 of the connection electrode 112.

Each of the pixel electrodes 111 and a pixel circuit unit PXC may be integral with each other. Each of the pixel electrodes 111 may receive a pixel voltage or an anode voltage from the pixel circuit unit PXC. The pixel electrodes 111 may include tungsten (W), copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

The first insulating layer INS1 may be disposed on the first substrate SUB1 on which the pixel electrodes 111 are not disposed. The first insulating layer INS1 may be disposed between the pixel electrodes 111. The first insulating layer INS1 may be formed of an inorganic layer such as a silicon oxide ($SiO_2$) layer, an aluminum oxide ($Al_2O_3$) layer, or a hafnium oxide ($HfO_x$) layer. The first insulating layer INS1 may have a thickness t2 smaller than the thickness t1 of the pixel electrodes 111 to expose the pixel electrodes 111. Accordingly, the pixel electrodes 111 may protrude toward the light emitting layer 120 through the first insulating layer INS1.

The light emitting layer 120 may include multiple emission areas EA1 through EA3 to emit light. The light emitting layer 120 may include connection electrodes 112, light emitting elements LE, a second insulating layer INS2, a common electrode CE, wavelength conversion layers QDL, a partition wall or bank PW, a first reflective layer RF1, a second reflective layer RF2, and multiple color filters CF1 through CF3. The connection electrode 112, the light emitting element LE, the second insulating layer INS2, the common electrode CE, and the wavelength conversion layer QDL may be collectively referred to as a light emitting element portion LEP.

Each of the connection electrodes 112 may be disposed on a corresponding pixel electrode 111. For example, the connection electrodes 112 may be connected one-to-one to the pixel electrodes 111. The connection electrodes 112 may be formed to have a width W2 greater than a width W1 of the pixel electrodes 111 in the first direction DR1.

The connection electrodes 112 may serve as bonding metals for bonding the pixel electrodes 111 and the light emitting elements LE in a manufacturing process. For example, the connection electrodes 112 may include at least one of gold (Au), copper (Cu), tin (Sn), silver (Ag), aluminum (Al), and titanium (Ti).

Referring to FIG. 8, although the first insulating layer INS1 is formed to have a uniform thickness, an upper portion of each pixel electrode 111 may not be flat. The pixel electrodes 111 may have a non-uniform thickness. For example, each of the pixel electrodes 111 may become thinner toward its center. Each of the pixel electrodes 111 may have a groove 111-g in the center. Edge portions 111-e of each of the pixel electrodes 111 may have a round chamfered shape.

A thickness t11 of a thinnest portion of each pixel electrode 111 may be greater than a thickness t2 of the first insulating layer INS1. The thinnest portion of each pixel electrode 111 may be a center of the groove 111-g. Therefore, a thickness of a central portion of the groove 111-g of each pixel electrode 111 may be greater than the thickness t2 of the first insulating layer INS1.

Referring again to FIGS. 6 through 8, the light emitting elements LE may be disposed in a first emission area EA1, a second emission area EA2, and a third emission area EA3, respectively. The light emitting elements LE may be vertical light emitting diode elements extending long in the third direction DR3. For example, a length of each light emitting element LE in the third direction DR3 may be greater than a length in the horizontal direction. The length in the horizontal direction may be a length in the first direction DR1 or a length in the second direction DR2. For example, the length of each light emitting element LE in the third direction DR3 may be in a range of about 1 μm to about 5 μm.

Referring to FIG. 9, the light emitting elements LE may be micro-light emitting diode elements. Each of the light emitting elements LE may include a first semiconductor layer SEM1, an electron blocking layer EBL, an active layer MQW, a superlattice layer SLT, and a second semiconductor layer SEM2. The first semiconductor layer SEM1, the electron blocking layer EBL, the active layer MQW, the superlattice layer SLT, and the second semiconductor layer SEM2 may be sequentially stacked in the third direction DR3.

Each of the light emitting elements LE may have a shape such as a cylinder, a disk, or a rod having a width greater than a height. However, the disclosure is not limited thereto, and each of the light emitting elements LE may have various shapes such as a rod, a wire, a tube, polygonal prisms such as a cube, a rectangular parallelepiped, a hexagonal prism, and a shape extending in a direction and having a partially inclined outer surface.

The first semiconductor layer SEM1 may be disposed on a connection electrode 112. The first semiconductor layer SEM1 may be doped with a dopant of a first conductive type such as Mg, Zn, Ca, Se, or Ba. For example, the first semiconductor layer SEM1 may be p-GaN doped with p-type Mg. A thickness Tsem1 of the first semiconductor layer SEM1 may be in a range of about 30 nm to about 200 nm in the third direction DR3.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be p-AlGaN doped with p-type Mg. A thickness Teb1 of the electron blocking layer EBL may be in a range of about 10 nm to about 50 nm in the third direction DR3. The electron blocking layer EBL may be omitted.

The active layer MQW may be disposed on the electron blocking layer EBL. The active layer MQW may emit light by combination of electron-hole pairs in response to electrical signals received though the first semiconductor layer SEM1 and the second semiconductor layer SEM2. The active layer MQW may emit first light having central wavelength band in the range of about 450 nm to about 495 nm, for example, light in a blue wavelength band, but the disclosure is not limited thereto.

The active layer MQW may have a single or multiple quantum well structure. In case that the active layer MQW has a material having a multiple quantum well structure, it may have a structure in which multiple well layers and multiple barrier layers are alternately stacked each other. For example, the well layers may be made of InGaN, and the barrier layers may be made of GaN or AlGaN, but the disclosure is not limited thereto. The well layers may have a thickness in a range of about 1 nm to about 4 nm, and the barrier layers may have a thickness in a range of about 3 nm to about 10 nm in the third direction DR3.

In another embodiment, the active layer MQW may have a structure in which a semiconductor material having a large band gap energy and a semiconductor material having a small band gap energy are alternately stacked each other or may include group 3 to 5 semiconductor materials depending on the wavelength band of light that it emits. Light emitted from the active layer MQW is not limited to the first light (light in the blue wavelength band). In another embodiment, second light (light in a green wavelength band) or third light (light in a red wavelength band) may be emitted.

The superlattice layer SLT may be disposed on the active layer MQW. The superlattice layer SLT may be a layer for relieving stress between the second semiconductor layer SEM2 and the active layer MQW. For example, the superlattice layer SLT may be made of InGaN or GaN. A thickness Tslt of the superlattice layer SLT may be in a range of about 50 nm to about 200 nm in the third direction DR3. The superlattice layer SLT may be omitted.

The second semiconductor layer SEM2 may be disposed on the superlattice layer SLT. The second semiconductor layer SEM2 may be doped with a dopant of a second conductivity type such as Si, Ge, or Sn. For example, the second semiconductor layer SEM2 may be n-GaN doped with n-type Si. A thickness Tsem2 of the second semiconductor layer SEM2 may be in a range of about 500 nm to about 1 μm in the third direction DR3.

Referring again to FIGS. 6 through 8, the second insulating layer INS2 may be disposed on side surfaces of each of the light emitting elements LE and the connection electrodes 112 and on the first insulating layer INS1 on which the connection electrodes 112 are not disposed. The second insulating layer INS2 may not cover the entire upper surface of each of the light emitting elements LE. The second insulating layer INS2 may include multiple openings OP1 through OP3 exposing the upper surfaces of the light emitting elements LE. The openings OP1 through OP3 may include a first opening OP1 in the first emission area EA1, a second opening OP2 in the second emission area EA2, and a third opening OP3 in the third emission area EA3. The second insulating layer INS2 may cover the upper surfaces of the light emitting elements LE other than the openings OP1 through OP3. The second insulating layer INS2 may be formed of an inorganic layer such as a silicon oxide ($SiO_2$) layer, an aluminum oxide ($Al_2O_3$) layer, or a hafnium oxide ($HfO_x$) layer, but the disclosure is not limited thereto.

The common electrode CE may be disposed on the entire area of the first substrate SUB1, and a common voltage may be applied to the common electrode CE. Therefore, the common electrode CE may include a material having low resistance. The common electrode CE may be disposed on the second insulating layer INS2. The common electrode CE may be electrically connected to the light emitting elements LE through the openings OP1 through OP3. The common electrode CE may completely cover each of the light emitting elements LE in the openings OP1 through OP3. The common electrode CE may have a thin thickness to allow light to pass therethrough. The common electrode CE may include a transparent conductive material. For example, the common electrode CE may include a transparent conductive oxide (TCO) such as indium tin oxide (ITO) or indium zinc oxide (IZO). The thickness of the common electrode CE may be, but is not limited to, in a range of about 10 Å to about 200 Å.

The wavelength conversion layers QDL may be disposed on the common electrode CE in the first emission area EA1, the second emission area EA2, and the third emission area EA3, respectively. The wavelength conversion layers QDL may overlap the light emitting elements LE in the first emission area EA1, the second emission area EA2, and the third emission area EA3 in the third direction DR3 in the third direction DR3, respectively.

Each of the wavelength conversion layers QDL may include first wavelength conversion particles. The first wavelength conversion particles may convert the first light emitted from the light emitting element LE into fourth light. For example, the first wavelength conversion particles may convert light of the blue wavelength band into light of a yellow wavelength band. The first wavelength conversion particles may be quantum dots, quantum rods, a fluorescent material, or a phosphorescent material. The quantum dots may include group IV nanocrystals, group II-VI compound nanocrystals, group III-V compound nanocrystals, group IV-VI nanocrystals, or a combination thereof.

The quantum dot may include a core and a shell overcoating the core. The core may be, but is not limited to, at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. The shell may be, but is not limited to, at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

Each of the wavelength conversion layers QDL may further include scatterers for scattering light from a light emitting element LE in random directions. The scatterers may include metal oxide particles or organic particles. For example, the metal oxide particles may be titanium oxide ($TiO_2$), zirconium oxide ($ZrO_2$), silicon dioxide ($SiO_2$), aluminum oxide ($Al_2O_3$), indium oxide ($In_2O_3$), zinc oxide (ZnO), or tin oxide ($SnO_2$). The organic particles may include an acrylic resin or a urethane resin. A diameter of the scatterers may be several to several tens of nanometers.

The bank PW may be disposed between the light emitting elements LE and between the wavelength conversion layers QDL. The bank PW may separate the emission areas EA1 through EA3 and the non-emission area NEA. The bank PW may be formed in a grid pattern over the entire display area DPA. The bank PW may not be disposed in the emission areas EA1 through EA3 and may be disposed in the non-emission area NEA.

The bank PW may provide spaces in which the wavelength conversion layers QDL are formed. For example, the bank PW may define areas of the wavelength conversion layers QDL. The bank PW may include an organic insulating material and have a thickness. The organic insulating material may include, for example, an epoxy resin, an acrylic resin, a cardo resin, or an imide resin.

The first reflective layer RF1 may be disposed on the side surfaces of the light emitting elements LE and the second insulating layer INS2. The first reflective layer RF1 may be disposed between the bank PW and the second insulating layer INS2.

The first reflective layer RF1 may reflect light travelling in all lateral directions instead of an upward direction among light emitted from the light emitting elements LE. The first reflective layer RF1 may include a metal having high reflectivity, such as aluminum (Al). A thickness of the reflective layer RF1 may be about 0.1 μm.

The second reflective layer RF2 may be disposed on side surfaces of each of the bank PW and the wavelength conversion layers QDL and may be disposed between the bank PW and the wavelength conversion layers QDL. The second reflective layer RF2 may be disposed in the non-emission area NEA. The second reflective layer RF2 may include a metal having high reflectivity, such as aluminum (Al). A thickness of the second reflective layer RF2 may be about 0.1 μm.

The second reflective layer RF2 may be disposed in the non-emission area NEA overlapping a light blocking member BM in the third direction DR3, which will be described below, to prevent color mixing of lights between the emission areas EA1 through EA3.

In an embodiment, the light emitting element LE of the first emission area EA1 may emit blue first light, the light emitting element LE of the second emission area EA2 may emit red second light, and the light emitting element LE of the third emission area EA3 may emit green third light. The light blocking member BM may prevent color mixing of lights between the emission areas EA1 through EA3.

The color filters CF1 through CF3 may be disposed on the bank PW and the wavelength conversion layers QDL. The color filters CF1 through CF3 may overlap the pixel circuit parts PXC and the wavelength conversion layers QDL in the third direction DR3. The color filters CF1 through CF3 may include a first color filter CF1, a second color filter CF2, and a third color filter CF3.

The first color filter CF1 may be disposed on the wavelength conversion layer QDL in the first emission area EA1. The first color filter CF1 may transmit the first light and absorb or block the second light and the third light. For example, the first color filter CF1 may transmit light of the blue wavelength band and absorb or block light of the green and red wavelength bands.

The second color filter CF2 may be disposed on the wavelength conversion layer QDL in the second emission area EA2. The second color filter CF2 may transmit the second light and absorb or block the first light and the third light. For example, the second color filter CF2 may transmit light of the green wavelength band and absorb or block light of the blue and red wavelength bands.

The third color filter CF3 may be disposed on the wavelength conversion layer QDL in the third emission area EA3. The third color filter CF3 may transmit the third light and absorb or block the first light and the second light. For example, the third color filter CF3 may transmit light of the red wavelength band and absorb or block light of the blue and green wavelength bands.

An area of each of the color filters CF1 through CF3 may be equal to or greater than an area of each of the emission areas EA1 through EA3 in a plan view. For example, the area of the first color filter CF1 may be equal to or greater than the area of the first emission area EA1 in a plan view. The area of the second color filter CF2 may be equal to or greater than the area of the second emission area EA2 in a plan view. The area of the third color filter CF3 may be equal to or greater than the area of the third emission area EA3 in a plan view.

The light blocking member BM may be disposed on the bank PW. The light blocking member BM may be disposed in the non-emission area NEA to block transmission of light. Like the bank PW, the light blocking member BM may be arranged in a substantially grid shape in a plan view. The light blocking member BM may overlap the bank PW in the third direction DR3 and may not be disposed in the emission areas EA1 through EA3.

In an embodiment, the light blocking member BM may include an organic light blocking material and may be formed by coating and exposing the organic light blocking material. The light blocking member BM may include a dye or pigment having light blocking properties and may be a black matrix. At least a portion of the light blocking member BM may overlap adjacent color filters CF1 through CF3 in the third direction DR3, and the color filters CF1 through CF3 may be disposed on at least a portion of the light blocking member BM.

In case that the light blocking member BM is disposed on the bank PW, at least a portion of external light may be absorbed by the light blocking member BM. Accordingly, color distortion due to reflection of the external light may be reduced. The light blocking member BM may prevent color mixing by preventing intrusion of light between adjacent emission areas, thereby improving a color gamut.

A buffer layer BF may be disposed under the color filters CF1 through CF3 and the light blocking member BM. The buffer layer BF may be disposed on the bank PW and the wavelength conversion layers QDL. A surface, for example, an upper surface of the buffer layer BF may contact lower surfaces of the color filters CF1 through CF3 and the light blocking member BM. Another surface of the buffer layer BF, for example, a lower surface of the buffer layer BF may contact upper surfaces of the bank PW and the wavelength conversion layers QDL. The buffer layer BF may include an inorganic insulating material. For example, the buffer layer BF may include, but is not limited to, silicon oxide ($SiO_x$), silicon nitride ($SiN_x$), silicon oxynitride ($SiO_xN_y$), aluminum oxide ($Al_xO_y$), or aluminum nitride (AlN). The buffer layer BF may have a thickness in a range of, for example, about 0.01 μm to about 1 μm. The buffer layer BF may be omitted.

Display devices according to other embodiments will now be described with reference to other drawings.

FIG. 10 is a schematic cross-sectional view illustrating a pixel electrode 111 and a light emitting element LE according to an embodiment.

Referring to FIG. 10, the embodiment is different from the embodiment of FIGS. 6 through 8 in that the pixel electrode 111 may be formed as a multilayer. Thus, a description of the same elements as those described above will be given briefly or omitted, and differences will be described in detail.

Referring to FIG. 10, in the embodiment, the pixel electrode 111 may include a lower electrode layer 111-1 and an upper electrode layer 111-3.

The lower electrode layer 111-1 may be disposed in a lowermost portion of the pixel electrode 111 and may be electrically connected to a pixel circuit unit PXC. The lower electrode layer 111-1 may bond the pixel electrode 111 to the pixel circuit unit PXC. The lower electrode layer 111-1 may include a metal oxide, for example, titanium oxide ($TiO_2$), zirconium oxide ($ZrO_2$), silicon dioxide ($SiO_2$), aluminum oxide ($Al_2O_3$), indium oxide ($In_2O_3$), zinc oxide (ZnO), or tin oxide ($SnO_2$).

The upper electrode layer 111-3 may be disposed on the lower electrode layer 111-1 and directly contact the connection electrode 112. The upper electrode layer 111-3 may be disposed between the lower electrode layer 111-1 and the connection electrode 112 and may bond the pixel electrode 111 to the connection electrode 112. The upper electrode layer 111-3 may include a metal, for example, tungsten (W), copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

Although the pixel electrode 111 having two layers is illustrated in the embodiment, the disclosure is not limited thereto, and the pixel electrode 111 may be formed in a multilayer structure. For example, the pixel electrode 111 may further include a reflective electrode layer (not illustrated) between the lower electrode layer 111-1 and the upper electrode layer 111-3. The reflective electrode layer (not illustrated) may reflect light, which is emitted from the light emitting element LE, to the upward direction. The reflective electrode layer (not illustrated) may include a metal having high reflectivity, for example, silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

However, the disclosure is not limited thereto. In an embodiment, the lower electrode layer 111-1 of the pixel electrode 111 may be omitted. The pixel electrode 111 may have a two-layer structure of a reflective electrode layer (not illustrated) and the upper electrode layer 111-3 disposed on the reflective electrode layer (not illustrated).

FIG. 11 is a schematic cross-sectional view of a display device according to an embodiment. Referring to FIG. 11, the embodiment is different from the embodiment of FIGS. 6 through 8 in that a third reflective layer RF3 may be disposed on a bottom portion of each wavelength conversion layer QDL. Thus, a description of the same elements as those described above will be given briefly or omitted, and differences will be described in detail.

Referring to FIG. 11, in an embodiment, a length W1 of each wavelength conversion layer QDL in the first direction DR1 (a direction perpendicular to the thickness direction) may be greater than a length W2 of each light emitting element LE in the first direction DR1.

The third reflective layer RF3 may be disposed on the bottom of each wavelength conversion layer QDL in an area that does not overlap the light emitting element LE in the third direction DR3. The third reflective layer RF3 may extend in the first direction DR1 and the second direction DR2. The third reflective layer RF3 may be disposed in the emission areas EA1, EA2, and EA3. The third reflective layer RF3 may contact a bank PW and the wavelength conversion layers QDL. The third reflective layer RF3 may include a metal having high reflectivity, such as aluminum (Al). A thickness of the third reflective layer RF3 may be about 0.1 μm in the third direction.

FIG. 12 is a schematic cross-sectional view of a display device according to an embodiment. FIG. 13 is a schematic cross-sectional view of a display device according to an embodiment.

Referring to FIG. 12, a light emitting element LE of a first emission area EA1 may emit blue first light, a light emitting element LE of a second emission area EA2 may emit red second light, and a light emitting element LE of a third emission area EA3 may emit green third light. Each wavelength conversion layer QDL may include first scatterers SCP1 and a first base resin BRS1 to scatter light emitted from a light emitting element LE and to emit the light through a color filter CF1, CF2 or CF3.

Referring to FIG. 13, in an embodiment, light emitting elements LE respectively disposed in a first emission area EA1, a second emission area EA2, and a third emission area EA3 may emit blue first light. A wavelength conversion layer QDL may include a light transmission pattern 230 in the first emission area EA1, a first wavelength conversion pattern 240 in the second emission area EA2, and a second wavelength conversion pattern 250 in the third emission area EA3.

The light transmission pattern 230 may overlap the first emission area EA1 and a first color filter CF1 in the third direction DR3. The light transmission pattern 230 may transmit incident light. The first light emitted from the light emitting element LE disposed in the first emission area EA1 may be blue light. The first light, which is blue light, may pass through the light transmission pattern 230 and may be output from the first emission area EA1. The light transmission pattern 230 may include a first base resin BRS1 and first scatterers SCP1 dispersed in the first base resin BRS1. Since the first base resin BRS1 and the scatters have been described above, a description thereof will be omitted.

The first wavelength conversion pattern 240 may overlap the second emission area EA2 and a second color filter CF2 in the third direction DR3. The first wavelength conversion pattern 240 may convert or shift a peak wavelength of incident light into another specific peak wavelength and output light having the specific peak wavelength. In an embodiment, the first wavelength conversion pattern 240 may convert the first light emitted from the light emitting element LE of the second emission area EA2 into second light which is red light having a single peak wavelength in a range of about 610 nm to about 650 nm and may emit the second light.

The first wavelength conversion pattern 240 may include a second base resin BRS2 and second wavelength conversion particles WCP2 and second scatterers SCP2 dispersed in the second base resin BRS2.

The second base resin BRS2 may be made of a material having high light transmittance or may be made of the same material as the above-described first base resin BRS1.

The second wavelength conversion particles WCP2 may convert or shift a peak wavelength of incident light to another specific peak wavelength. In an embodiment, the second wavelength conversion particles WCP2 may convert light of the first color, which is blue light provided by the light emitting element LE, into red light having a single peak wavelength in a range of about 610 nm to about 650 nm. The second wavelength conversion particles WCP2 may be, for example, quantum dots, quantum rods, or phosphors. The second wavelength conversion particles WCP2 may substantially the same as or similar to the first wavelength conversion particles WCP1 and thus a detailed description thereof will be omitted.

A portion of the first light which is blue light emitted from the light emitting element LE may pass through the first wavelength conversion pattern 240 without being converted into the second light, which is red light, by the second wavelength conversion particles WCP2. However, the light not converted into red light may be blocked by the second color filter CF2. On the other hand, red light converted from the first light emitted from the light emitting element LE by the first wavelength conversion pattern 240 may pass through the second color filter CF2 and may exit to the outside.

The second wavelength conversion pattern 250 may overlap the third emission area EA3 and a third color filter CF3 in the third direction DR3. The second wavelength conversion pattern 250 may convert or shift a peak wavelength of incident light into another specific peak wavelength and output light having the specific peak wavelength. In an embodiment, the second wavelength conversion pattern 250 may convert the first light emitted from the light emitting element LE of the third emission area EA3 into third light which is green light having a peak wavelength in a range of about 510 nm to about 550 nm and may emit the third light.

The second wavelength conversion pattern 240 may include a third base resin BRS3 and third wavelength conversion particles WCP3 and third scatterers SCP3 dispersed in the third base resin BRS3.

The third base resin BRS3 may be made of a material having high light transmittance, may be made of the same material as the first base resin BRS1 and the second base resin BRS2, or may include at least one of the materials that may be used for the first base resin BRS1 and the second base resin BRS2.

The third wavelength conversion particles WCP3 may convert or shift a peak wavelength of incident light to another specific peak wavelength. In an embodiment, the third wavelength conversion particles WCP3 may convert the first light, which is blue light provided by the light emitting element LE, into the third light which is green light having a peak wavelength in a range of about 510 nm to about 550 nm and may emit the third light.

The third wavelength conversion particles WCP3 may be, for example, quantum dots, quantum rods, or phosphors. The third wavelength conversion particles WCP3 may be substantially the same as or similar to the first wavelength conversion particles WCP1 and thus a detailed description thereof will be omitted.

A portion of the first light which is blue light emitted from the light emitting element LE may not be converted into the third light, which is green light, by the third wavelength conversion particles WCP3. However, the first light not converted into green light may be blocked by the third color filter CF3 disposed on the second wavelength conversion pattern 250. On the other hand, green light converted from the first light by the second wavelength conversion pattern 250 may pass through the third color filter CF3 and may exit to the outside.

In the display device 10 according to the embodiment, since the wavelength conversion layer QDL including the light transmission pattern 230, the first wavelength conversion pattern 240, and the second wavelength conversion pattern 250 is formed, the emission efficiency of blue, green and red light may be improved.

FIGS. 14 through 27 are schematic cross-sectional views illustrating a method of manufacturing a display device according to an embodiment. FIG. 28 is a flowchart illustrating the method of manufacturing the display device according to the embodiment. FIG. 29 is a flowchart illustrating a method of manufacturing a semiconductor circuit board according to an embodiment.

Referring to FIGS. 14 through 17, a first substrate SUB1 including pixel electrodes 111 may be formed (operation S110 in FIG. 28).

Figure 14:
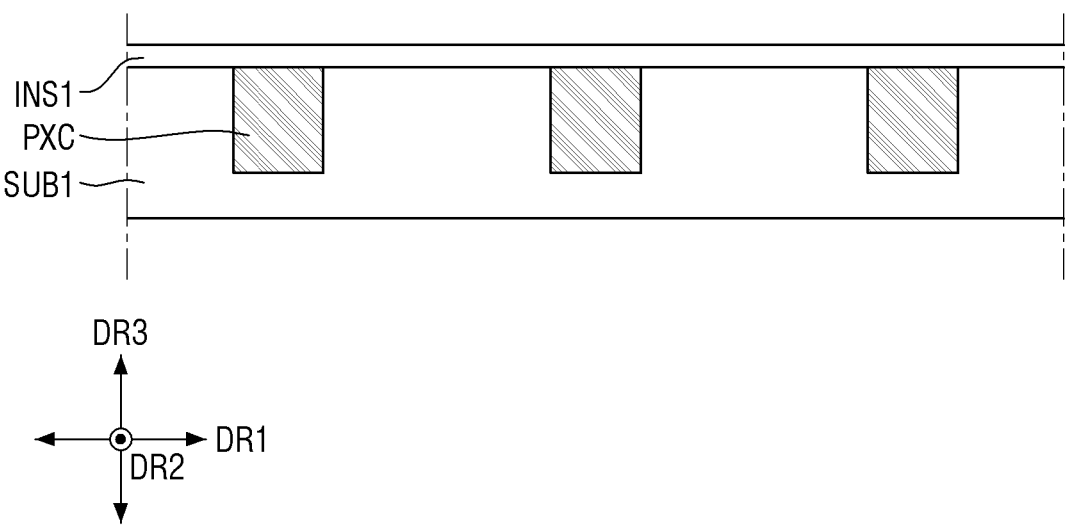

Referring to FIG. 14, pixel circuit parts PXC may be formed on the first substrate SUB1, and a first insulating layer INS1 may be formed on the pixel circuit parts PXC (operation S111 in FIG. 29).

The first substrate SUB1 may be a transparent insulating substrate and may be a glass or quartz substrate. Each of the pixel circuit parts PXC may include multiple thin-film transistors and a capacitor.

Figure 15:
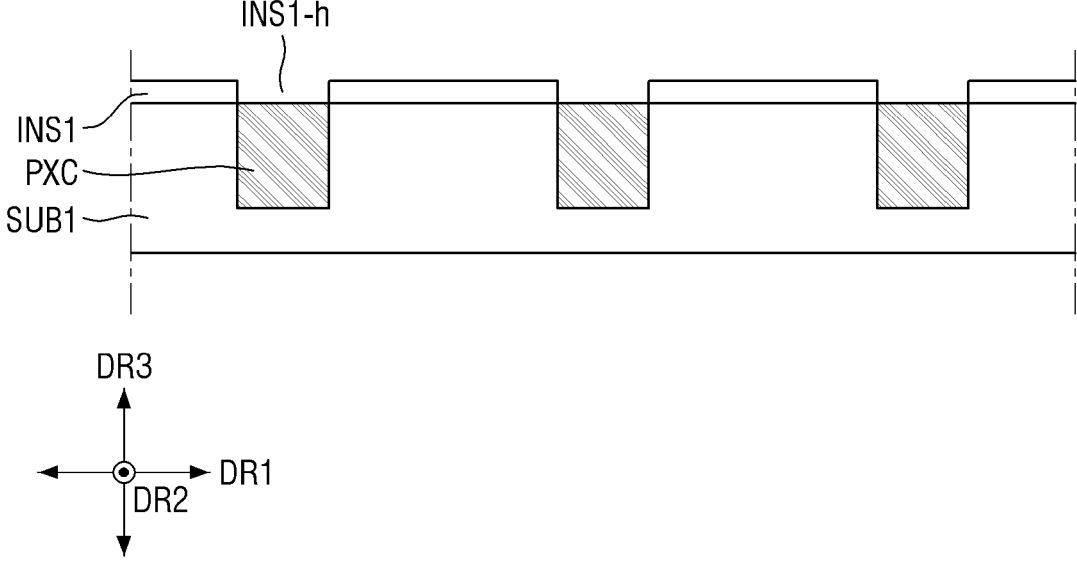

Referring to FIG. 15, contact holes INS1-*h* exposing the pixel circuit parts PXC may be formed on the first insulating layer INS1 (operation S112 in FIG. 29).

Figure 16:
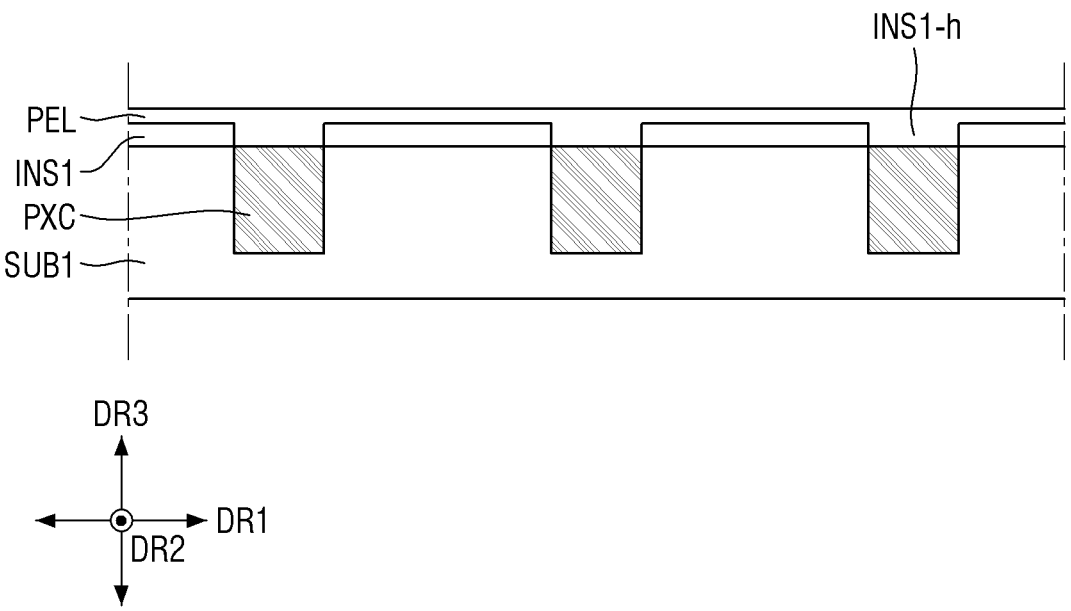

Referring to FIG. 16, a pixel electrode layer PEL may be formed on the first insulating layer INS1 (operation S113 in FIG. 29). The pixel electrode layer PEL may be connected to the pixel circuit parts PXC through the contact holes INS1-*h* formed on the first insulating layer INS1.

Figure 17:
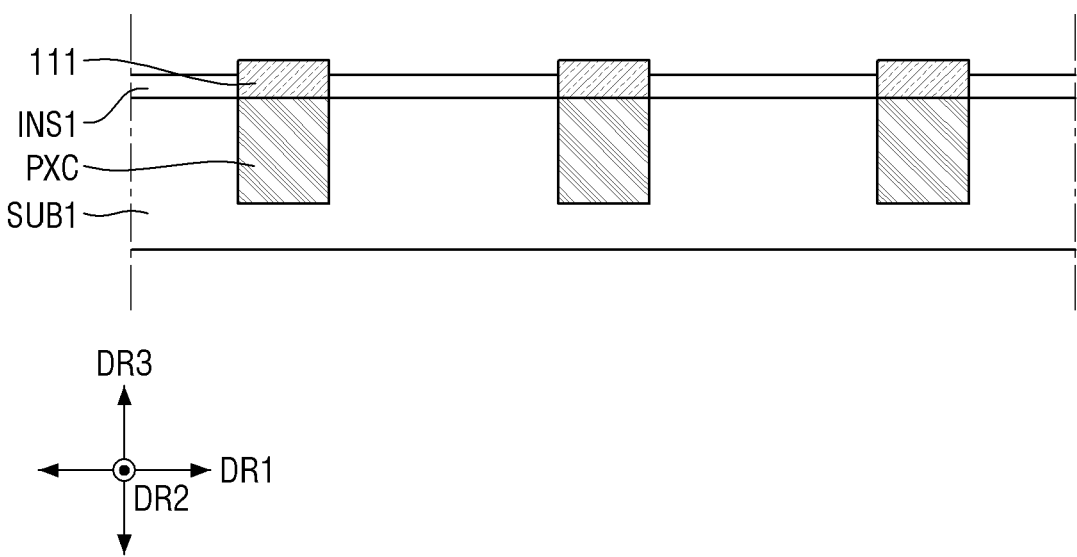

Referring to FIG. 17, the pixel electrode layer PEL and the first insulating layer INS1 may be selectively etched to form the pixel electrodes 111 (operation S114 in FIG. 29). The etching may be performed using a chemical mechanical method (CMP). The first substrate SUB1 on which the pixel electrode layer PEL is formed may be placed in a chemical mechanical polishing (CMP) facility, and etching may be performed until the first insulating layer INS1 is exposed by injecting a first slurry. The first slurry may be an abrasive for selectively polishing a metal surface of the pixel electrode layer PEL. The pixel electrode layer PEL may be polished in stages. For example, a pixel electrode area where the pixel electrodes 111 are formed even after the injection of the first slurry may be polished first, and an area other than the pixel electrode area may be polished.

The first insulating layer INS1 may be etched by injecting a second slurry into the CMP facility. The amount or injection time of the second slurry may be adjusted so that a thickness of the first insulating layer INS1 becomes smaller than a thickness of the pixel electrode layer PEL. The second slurry may be an abrasive for selectively polishing the surface of the first insulating layer INS1. The first slurry may be injected again to finely process an upper surface of the pixel electrode layer PEL, thereby forming the pixel electrodes 111. This fine process may remove scratch and unnecessary foreign matter. In case that the pixel electrodes 111 are formed to be thicker than the first insulating layer INS1 as in the embodiment, even if dishing occurs in the pixel electrodes 111, it is possible to prevent voids from being generated in connection electrodes 112 in case that the pixel electrodes 111 and the connection electrodes 112 are bonded together.

Figure 18:
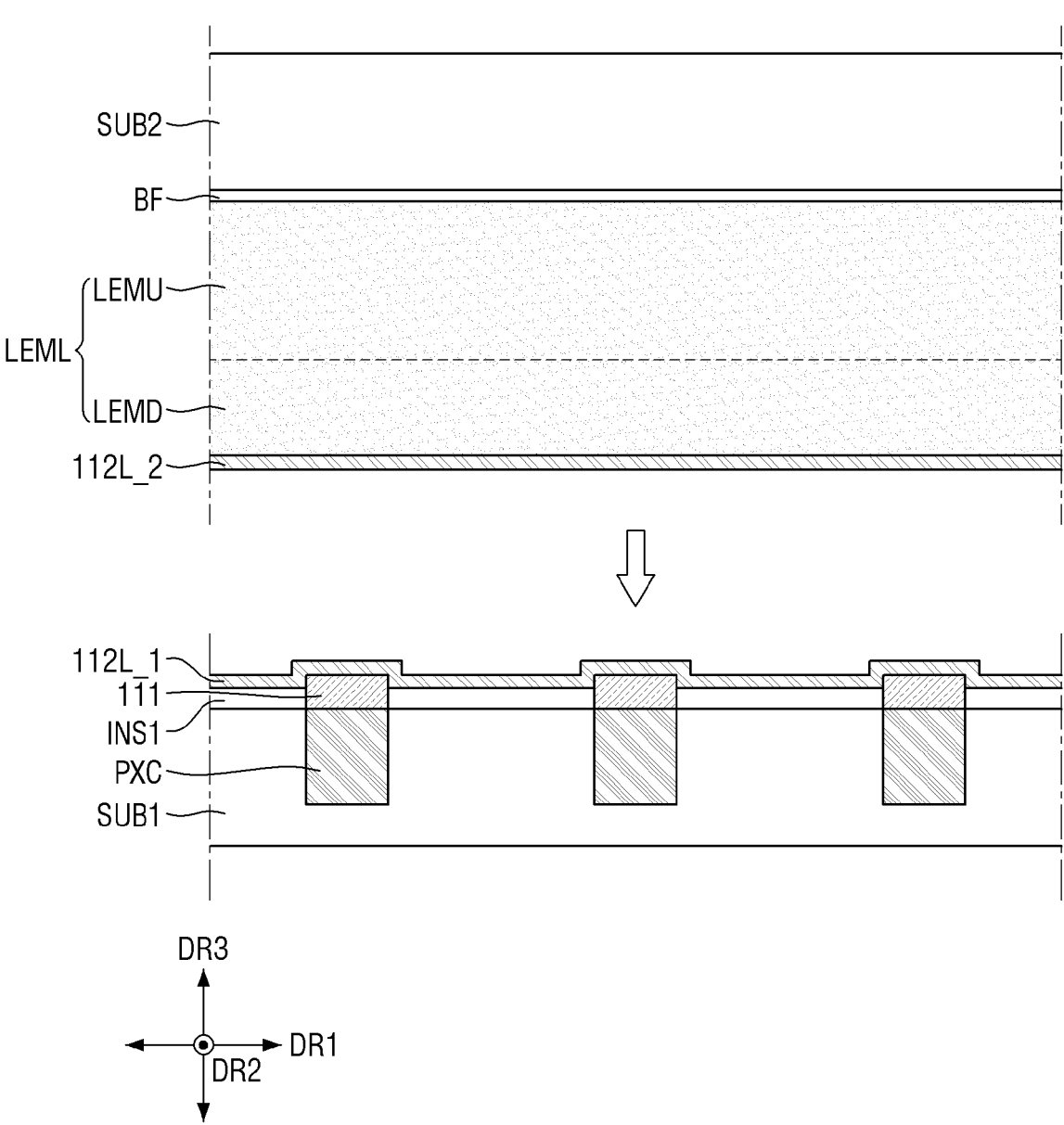

Referring to FIG. 18, a first connection electrode layer 112L_1 may be formed on the first insulating layer INS1 and the pixel electrodes 111, and a second connection electrode layer 112L_2 may be formed on a light emitting material layer LEML of a second substrate SUB2 (operation S120 in FIG. 28). The first connection electrode layer 112L_1 may include at least one of gold (Au), copper (Cu), tin (Sn), silver (Ag), aluminum (Al), and titanium (Ti). The second connection electrode layer 112L_2 may include at least one of gold (Au), copper (Cu), tin (Sn), silver (Ag), aluminum (Al), and titanium (Ti).

Figure 19:
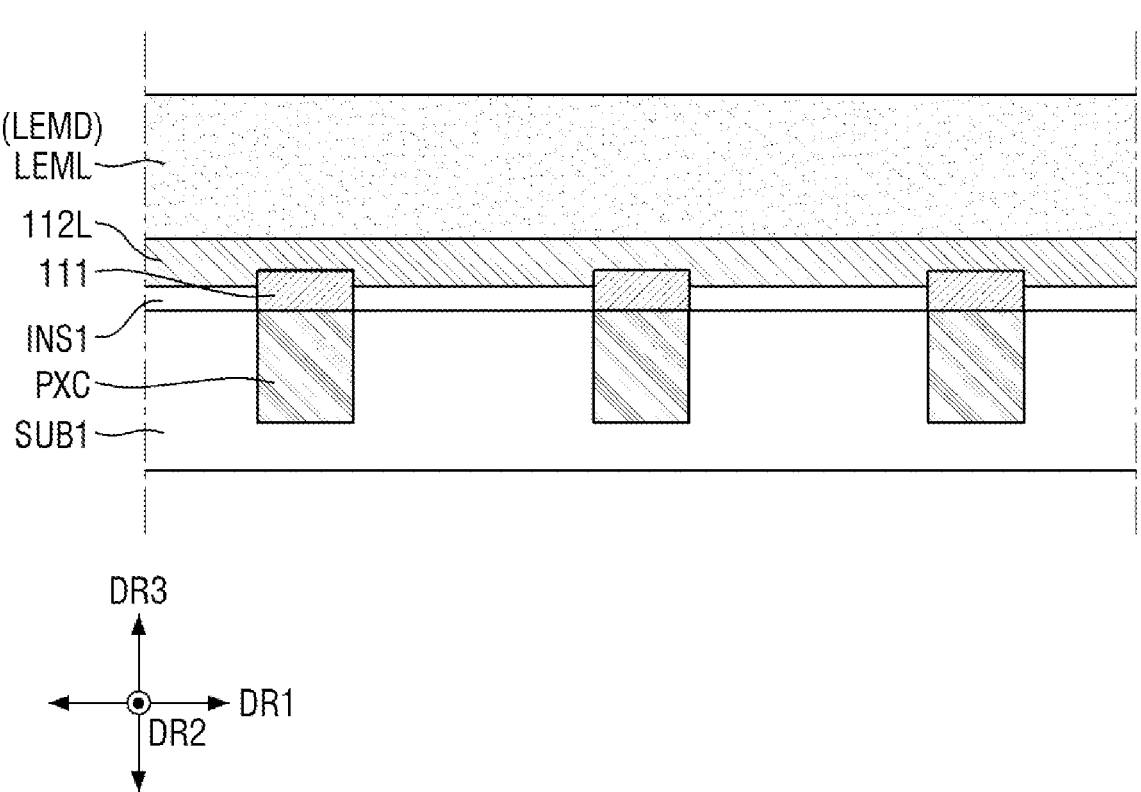

Referring to FIG. 19, the first connection electrode layer 112L_1 and the second connection electrode layer 112L_2 may be bonded together, and the second substrate SUB2 may be removed (operation S130 in FIG. 28).

For example, the first connection electrode layer 112L_1 of the first substrate SUB1 may be moved to contact the second connection electrode layer 112L_2 of the second substrate SUB2, and the first connection electrode layer 112L_1 and the second connection electrode layer 112L_2 may be melt-bonded together at a temperature to form one connection electrode layer.

The second substrate SUB2 and a buffer layer BF may be removed through a polishing process such as a CMP process and/or an etching process. A second semiconductor material layer LEMU of the light emitting material layer LEML may be removed through a polishing process such as a CMP process.

Figure 20:
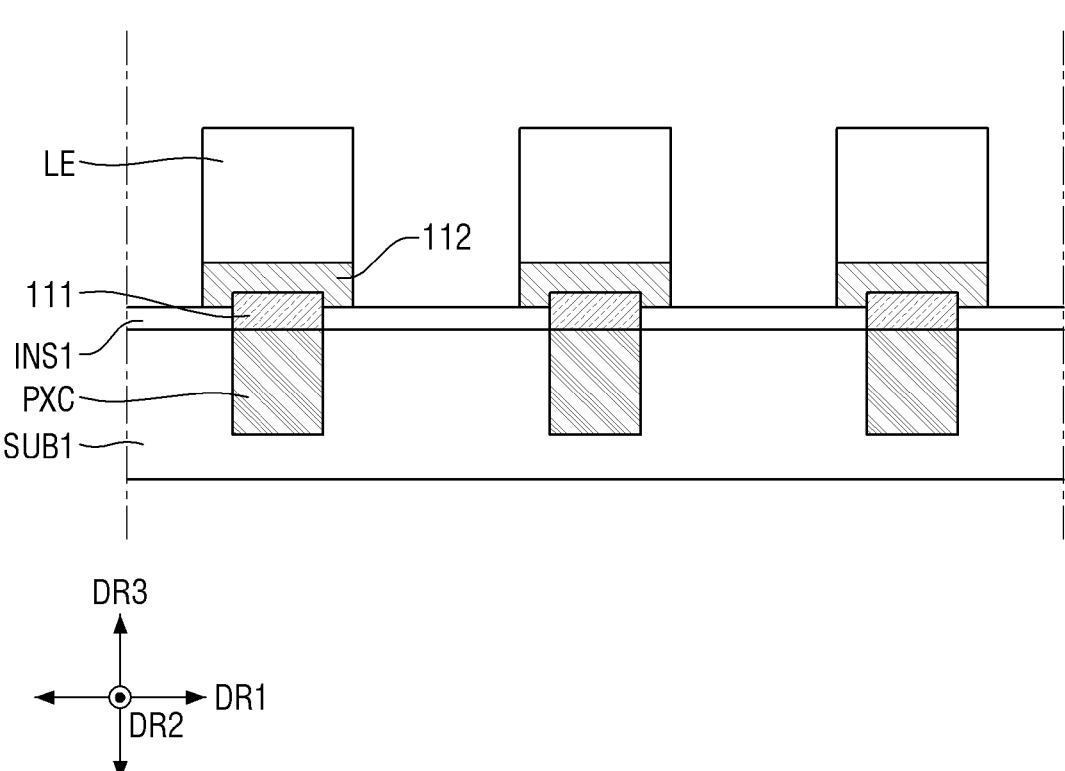

Referring to FIG. 20, light emitting elements LE and connection electrode 112 may be formed by etching the light emitting material layer LEML (operation S140 in FIG. 28).

Mask patterns (not illustrated) may be formed on an upper surface of the light emitting material layer LEML of FIG. 19. The upper surface of the light emitting material layer LEML may be an upper surface of a first light emitting material layer LEMD exposed by the removal of the second substrate SUB2, the buffer layer BF, and the second semiconductor material layer LEMU. The mask patterns may be placed in areas where the light emitting elements LE are to be formed. Therefore, the mask patterns may overlap the pixel electrodes 111 in the third direction DR3. The mask patterns may include a conductive material such as nickel (Ni). A thickness of the mask patterns may be in a range of about 0.01 μm to 1 about μm.

For example, the mask patterns may not be etched by an etching material for etching the light emitting material layer LEML. Accordingly, the light emitting material layer LEML in areas where the mask patterns are placed may not be etched. Therefore, the light emitting elements LE and connection electrode 112 may be formed on upper surfaces of the pixel electrodes 111, respectively. The mask patterns may be removed. The connection electrodes 112 may be disposed between the pixel electrodes 111 of the first substrate SUB1 and the light emitting material layer LEML of the second substrate SUB2 to serve as a bonding metal layer that bonds the pixel electrodes 111 of the first substrate SUB1 and the light emitting material layer LEML of the second substrate SUB2. For example, the connection electrodes 112 may be formed to surround protrusions of the pixel electrodes 111.

Referring to FIGS. 21 through 24, a second insulating layer INS2, a common electrode CE, and a first reflective layer RF1 may be formed (operation S150 in FIG. 28).

Figure 21:
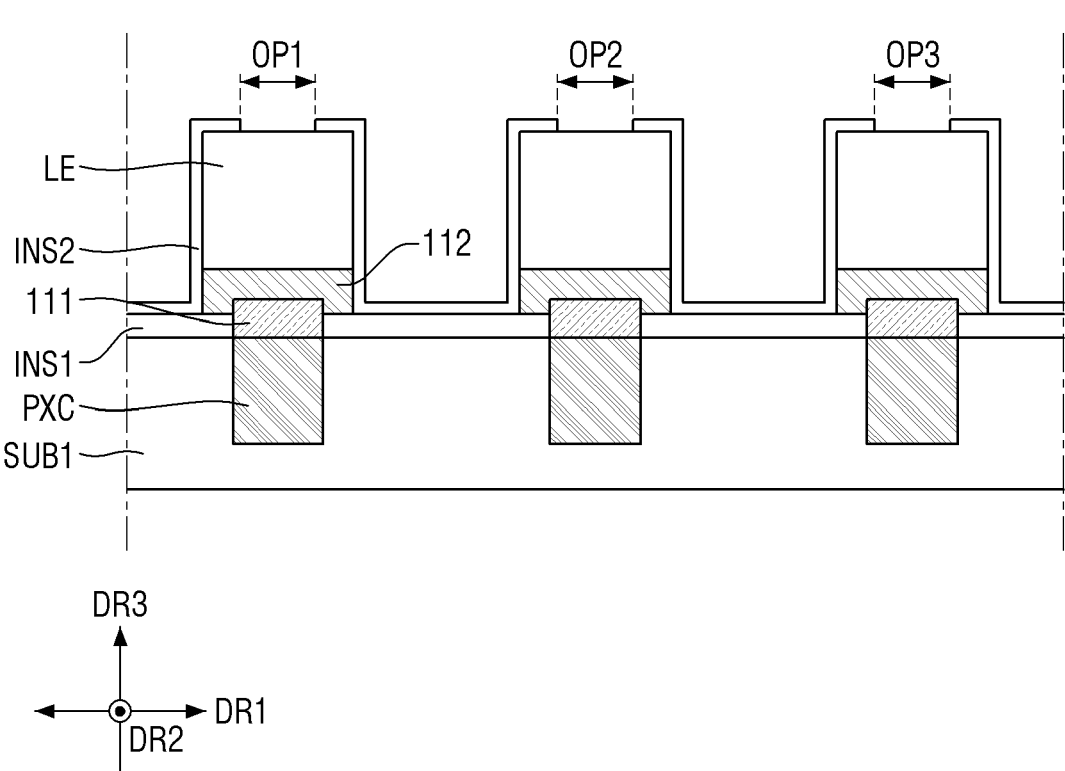

The second insulating layer INS2 may be deposited to cover the entire area of the first substrate SUB1 on which the light emitting elements LE are disposed. Openings OP1 through OP3 may be formed using photoresist. Accordingly, as illustrated in FIG. 21, the second insulating layer INS2 may be deposited on upper and side surfaces of the light emitting elements LE except for the openings OP1 through OP3, on side surfaces of the connection electrodes 112 and on the first insulating layer INS1 on which the light emitting elements LE are not disposed, and the upper surfaces of the light emitting elements LE may be exposed by the openings OP1 through OP3.

Figure 22:
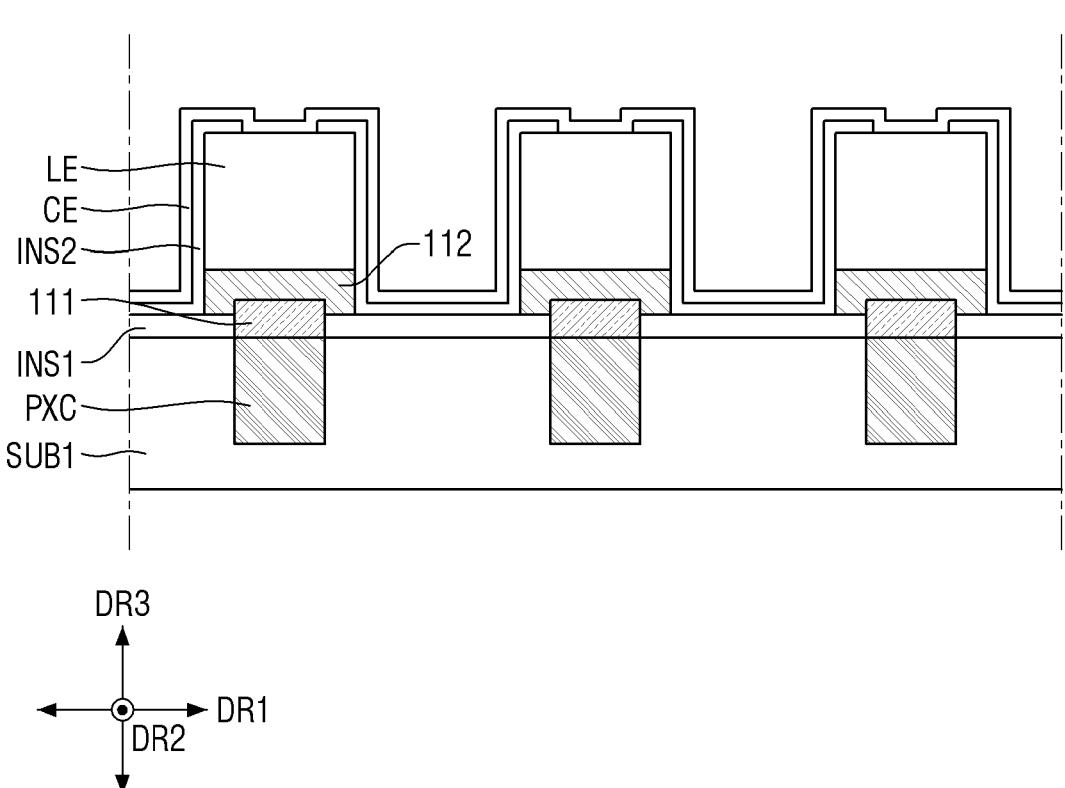

Referring to FIG. 22, the common electrode CE may be deposited on the upper surfaces of the light emitting elements LE not covered by the second insulating layer INS2 and on the second insulating layer INS2. The common electrode CE may include a transparent conductive oxide (TCO) such as indium tin oxide (ITO) or indium zinc oxide (IZO).

Figure 23:
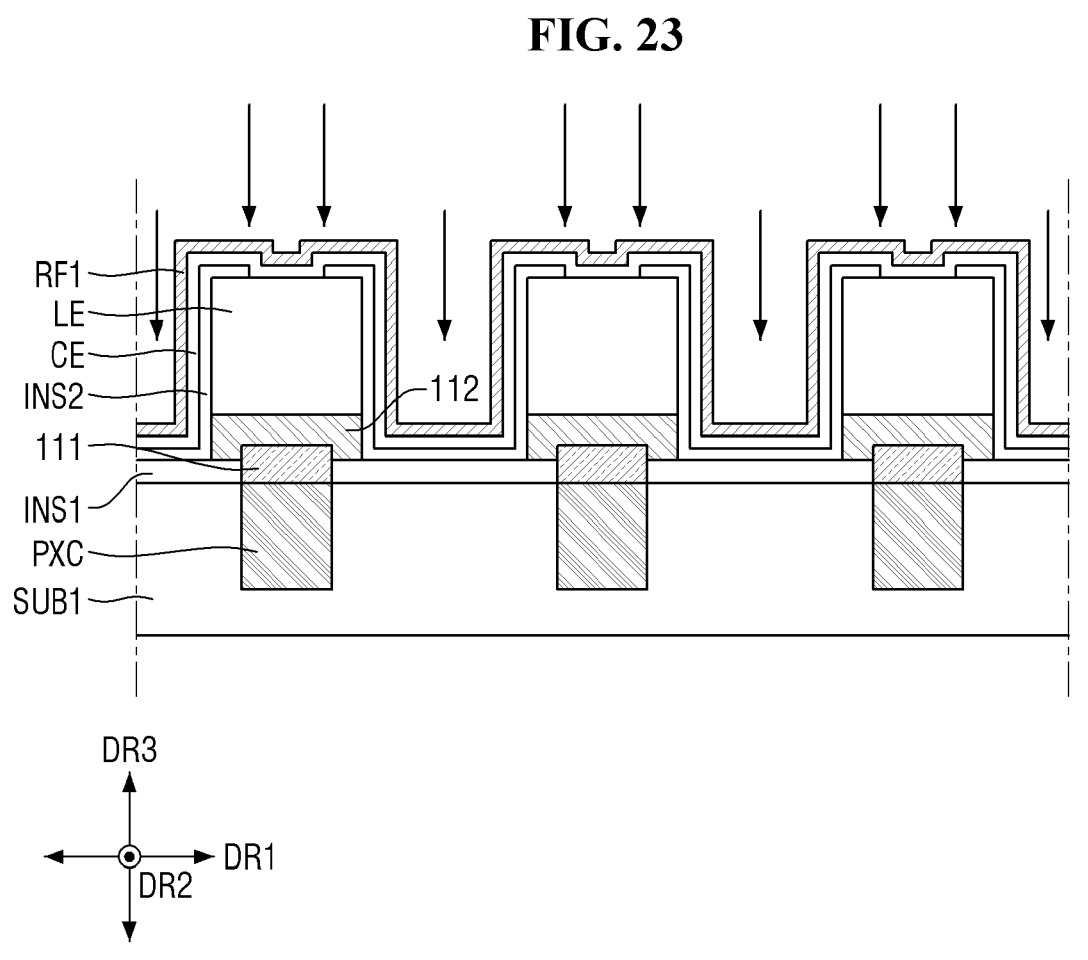
Figure 24:
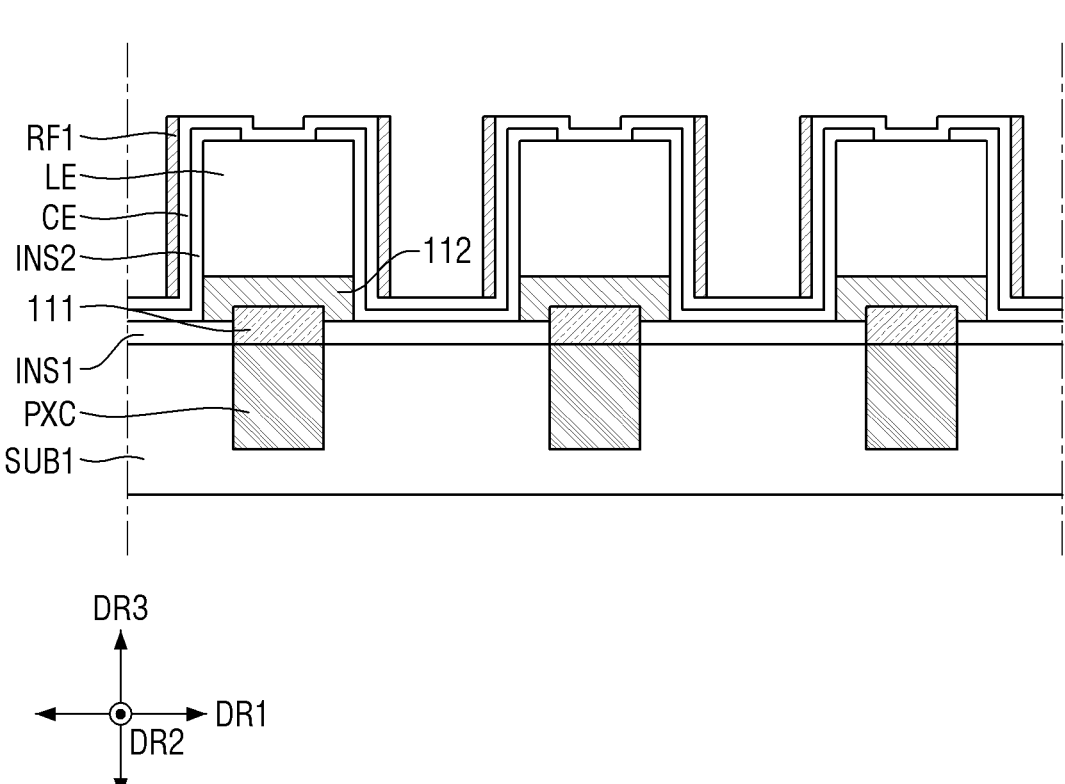

Referring to FIG. 23, the first reflective layer RF1 may be deposited to cover the common electrode CE. A large voltage difference may be formed in the third direction DR3, and the first reflective layer RF1 may be etched using an etching material without a mask. The etching material may be moved in the third direction DR3 by voltage control, for example, may be moved from top to bottom to etch the first reflective layer RF1. Accordingly, as illustrated in FIG. 24, as the first reflective layer RF1 disposed on a horizontal plane defined by the first direction DR1 and the second direction DR2 is removed, the first reflective layer RF1 disposed on a vertical plane defined by the third direction DR3 may not be removed. Therefore, the first reflective layer RF disposed on an upper surface of the common electrode CE may be removed in a non-emission area NEA and each of the light emitting elements LE in a first emission area EA1, a second emission area EA2, and a third emission area EA3. The reflective layer RF disposed on the side surfaces of the light emitting elements LE may not be removed. Accordingly, the reflective layer RF may be disposed on the common electrode CE overlapping the side surfaces of the light emitting element LE.

Figure 25:
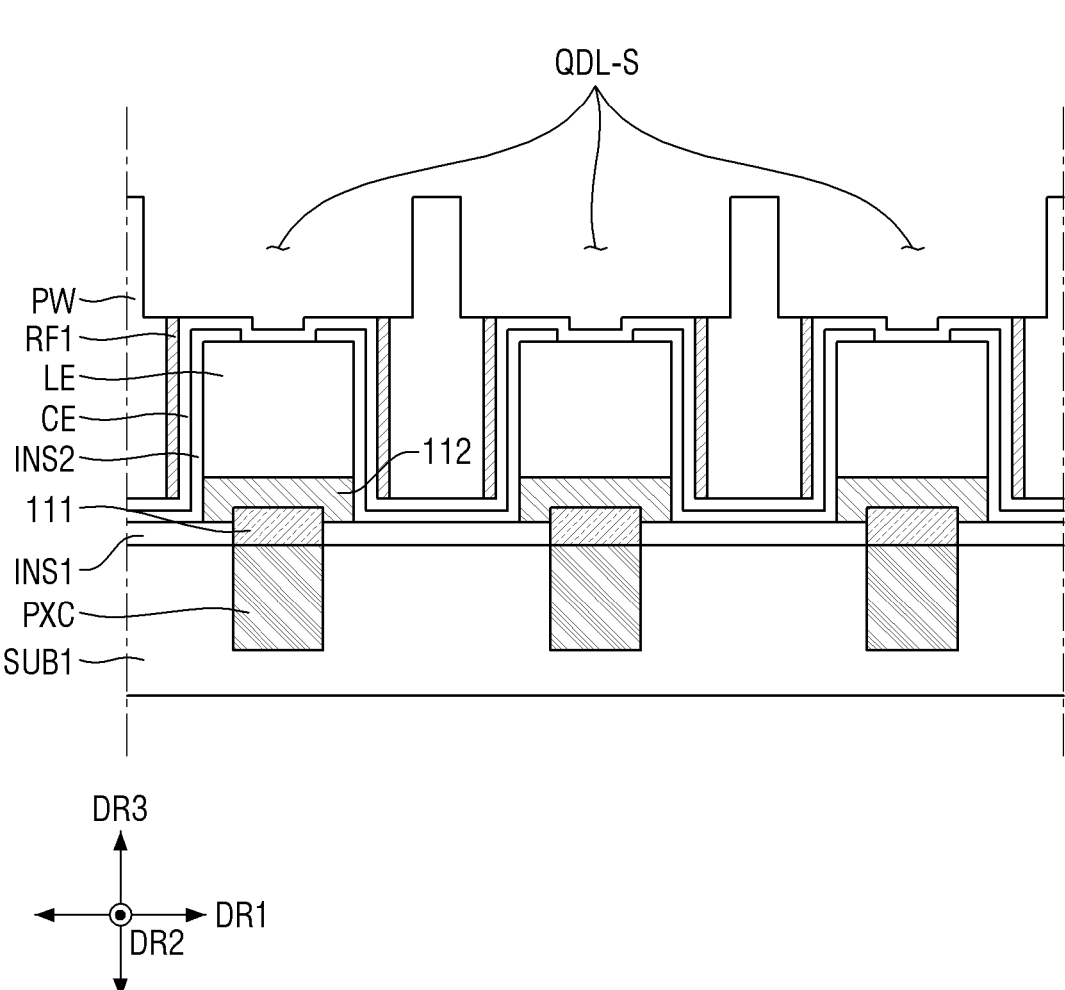
Figure 26:
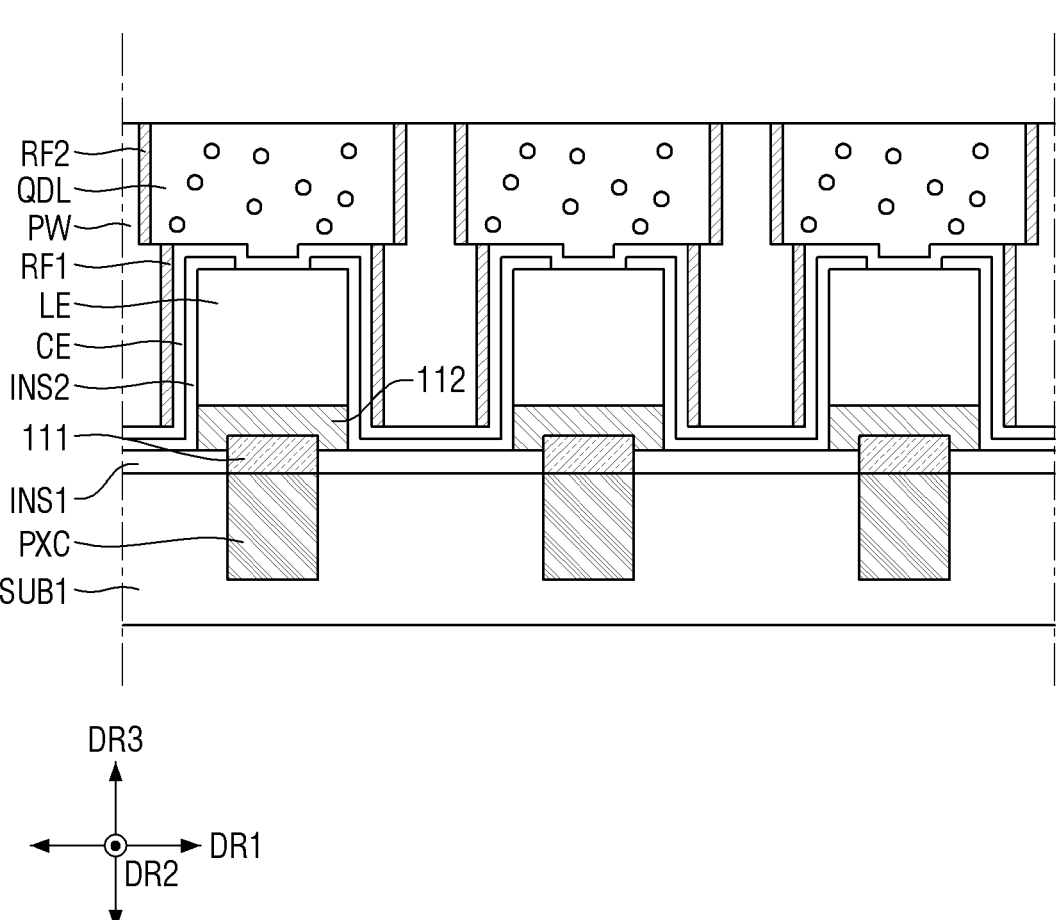

Referring to FIGS. 25 and 26, a bank PW, a second reflective layer RF2, and wavelength conversion layers QDL may be formed (operation S160 in FIG. 28).

For example, an organic material may be applied onto the light emitting elements LE on which the first reflective layer RF1 is formed as illustrated in FIG. 24. The organic material may be patterned by placing mask patterns (PR) in the non-emission area NEA. Accordingly, as illustrated in FIG. 25, the organic material in the non-emission area NEA may not be etched to form the bank PW, and spaces QDL-S for the wavelength conversion layers QDL may be formed in the emission areas EA1 through EA3 where the mask patterns are not disposed. The upper surface of the common electrode CE may be exposed at the bottom of the spaces QDL-S for the wavelength conversion layers QDL. The mask patterns may be removed.

A reflective layer RF may be deposited to cover the first substrate SUB1 on which the bank PW and the spaces QDL-S for the wavelength conversion layers QDL are formed. As in the case of forming the first reflective layer RF1, a large voltage difference may be formed in the third direction DR3, and the reflective layer RF may be etched using an etching material without a mask. Therefore, the reflective layer RF disposed on the bank PW and on the light emitting element LE in each of the first emission area EA1, the second emission area EA2, and the third emission area EA3 may be removed. The reflective layer RF disposed on side surfaces of the bank PW may not be removed. Accordingly, the reflective layer RF may be disposed on the side surfaces of the bank PW in each of the first emission area EA1, the second emission area EA2, and the third emission area EA3.

The wavelength conversion layers QDL may be formed in the spaces QDL-S for the wavelength conversion layers QDL between portions of the bank PW. The wavelength conversion layers QDL may be formed to fill the spaces QDL-S for the wavelength conversion layers QDL. The wavelength conversion layers QDL may be formed by performing a solution process, such as inkjet printing or imprinting, using a solution in which a first base resin is mixed with first wavelength conversion particles, but the disclosure is not limited thereto. The wavelength conversion layers QDL may be respectively formed in the spaces QDL-S for the wavelength conversion layers QDL and may be formed to overlap the emission areas EA1 through EA3.

Figure 27:
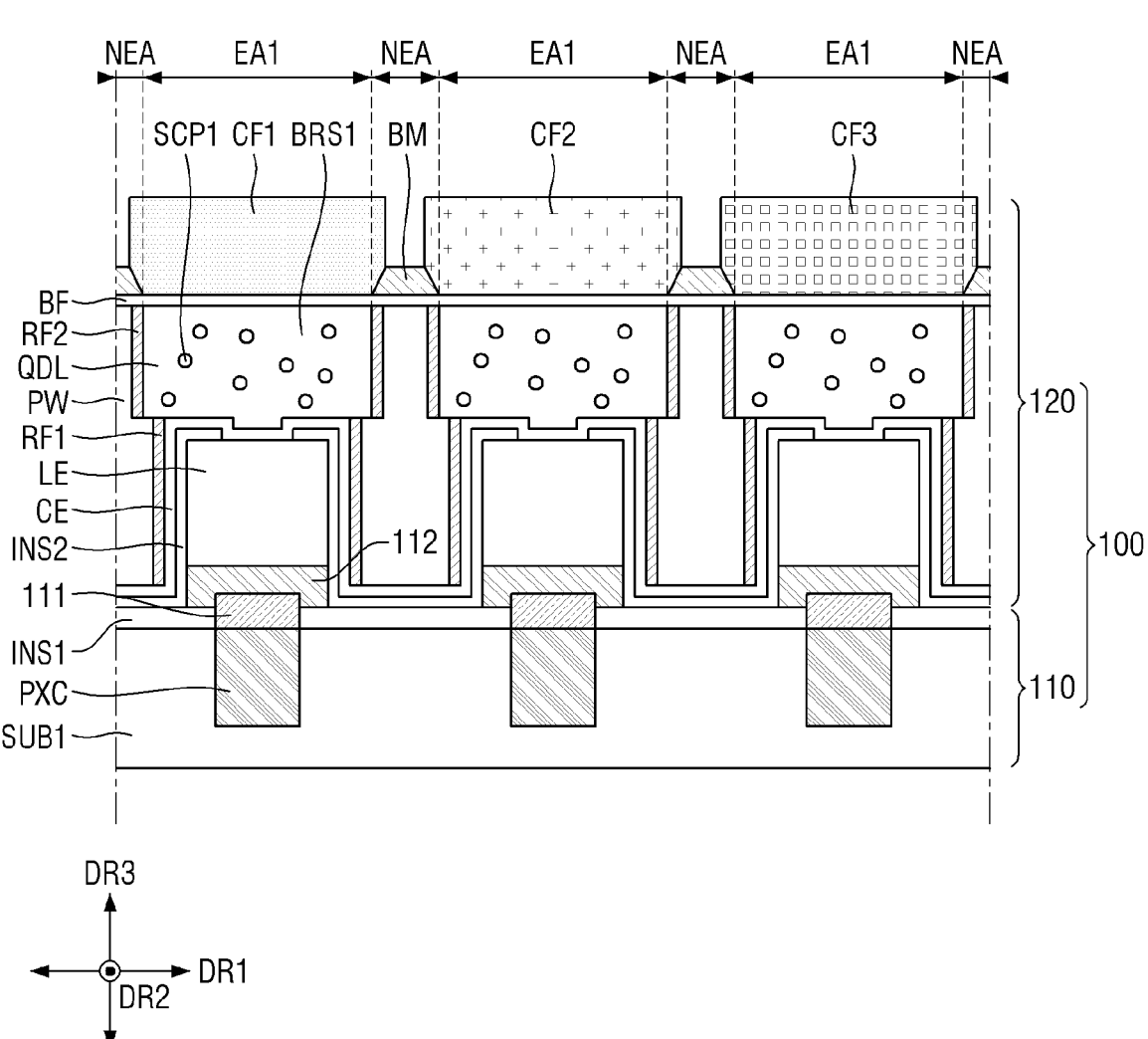

Referring to FIG. 27, multiple color filters CF1 through CF3 may be formed (operation S170 in FIG. 28).

In an embodiment, a buffer layer BF may be formed before the color filters CF1 through CF3 are formed.

The buffer layer BF may be formed to cover the bank PW and the wavelength conversion layers QDL. A surface, for example, an upper surface of the buffer layer BF may contact lower surfaces of the color filters CF1 through CF3 and a light blocking member BM. Another surface of the buffer layer BF, for example, a lower surface of the buffer layer BF may contact upper surfaces of the bank PW and the wavelength conversion layers QDL. The buffer layer BF may include an inorganic insulating material. For example, the buffer layer BF may include, but is not limited to, silicon oxide ($SiO_x$), silicon nitride ($SiN_x$), silicon oxynitride ($SiO_xN_y$), aluminum oxide ($Al_xO_y$), or aluminum nitride (AlN).

The light blocking member BM may be formed on the bank PW. The light blocking member BM may be formed by applying a light blocking material and patterning the light blocking material. The light blocking member BM may be formed to in the non-emission area NEA and not in the emission areas EA1 through EA3. The color filter CF1 may be formed on a wavelength conversion layer QDL defined by the light blocking member BM. The color filter CF1 may be formed by a photo process. The color filter CF1 may have a thickness of, but not limited to, equal to or less than about 1 μm. Similarly, other color filters may be formed in corresponding openings through a patterning process.

FIG. 30 is a schematic diagram showing a virtual reality device including a display device according to an embodiment. FIG. 30 shows a virtual reality device 1 to which the display device 10 according to the embodiment is applied.

Referring to FIG. 30, the virtual reality device 1 according to the embodiment may be a device in a form of glasses. The virtual reality device 1 according to the embodiment may include a display device 10, a left-eye lens 10a, a right-eye lens 10b, a support frame 20, left and right legs 30a and 30b, a reflective member 40, and a display device housing 50.

FIG. 30 illustrates a virtual reality device 1 including two legs 30a and 30b. The disclosure is not limited thereto. The virtual reality device 1 according to the embodiment may be applied to a head mounted display including a head mounted band that may be mounted on a head instead of the legs 30a and 30b. For example, the virtual reality device 1 according to the embodiment is not limited to the example shown in FIG. 30, and may be applied in various forms and in various electronic devices.

The display device housing 50 may receive the display device 10 and the reflective member 40. An image displayed on the display device 10 may be reflected from the reflective member 40 and provided to a user's right-eye through the right-eye lens 10b. Thus, the user may view a virtual reality image displayed on the display device 10 via the right-eye.

FIG. 30 illustrates that the display device housing 50 is disposed at a right end of the support frame 20. However, the disclosure is not limited thereto. For example, the display device housing 50 may be disposed at a left end of the support frame 20. The image displayed on the display device 10 may be reflected from the reflective member 40 and provided to the user's left-eye via the left-eye lens 10a. Thus, the user may view the virtual reality image displayed on the display device 10 via the left-eye. In another embodiment, the display device housing 50 may be disposed at each of the left end and the right end of the support frame 20. The user may view the virtual reality image displayed on the display device 10 via both the left-eye and the right-eye.

FIG. 31 is a schematic diagram showing a smart device including a display device according to an embodiment.

Referring to FIG. 31, a display device 10 according to an embodiment may be applied to a smart watch 2 as one of smart devices.

FIG. 32 is a schematic diagram showing a vehicle including a display device according to an embodiment. FIG. 32 shows a vehicle to which display devices according to an embodiment are applied.

Referring to FIG. 32, the display devices 10_a, 10_b, and 10_c according to the embodiment may be applied to the dashboard of the vehicle, applied to the center fascia of the vehicle, or applied to a CID (Center Information Display) disposed on the dashboard of the vehicle. Further, each of the display devices 10_d and 10_e according to the embodiment may be applied to each room mirror display that replaces each of side mirrors of the vehicle.

FIG. 33 is a schematic diagram showing a transparent display device including a display device according to an embodiment.

Referring to FIG. 33, a display device according to the embodiment may be applied to a transparent display device. The transparent display device may transmit light therethrough while displaying an image IM thereon. Therefore, a user located in front of the transparent display device may not only view the image IM displayed on the display device 10, but also see an object RS or a background located in rear of the transparent display device. In case that the display device 10 is applied to the transparent display device, the first substrate 110 of the display device 10 shown in FIG. 6 may include a light transmitting portion that may transmit light therethrough or may be made of a material that may transmit light therethrough.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:

a plurality of pixel circuit parts disposed on a substrate;

a plurality of pixel electrodes, each disposed on the plurality of pixel circuit parts;

a first insulating layer filling a space between the plurality of pixel electrodes;

a plurality of light emitting elements, each disposed on the plurality of pixel electrodes; and connection electrodes disposed between the plurality of light emitting elements and the plurality of pixel electrodes, wherein each of the plurality of pixel electrodes comprises a protrusion protruding toward a corresponding one of the connection electrodes; wherein each connection electrode is formed to cover and surround the protrusion of the pixel electrode.

2. The display device of claim 1, wherein each of the connection electrodes comprises:

a first connection electrode covering and surrounding the protrusion of the pixel electrode; and a second connection electrode electrically connected to each of the plurality of light emitting elements, and the first connection electrode and the second connection electrode are melt-bonded together.

3. The display device of claim 1, wherein a thickness of each of the plurality of pixel electrodes is greater than a thickness of the first insulating layer in a thickness direction of the substrate.

4. The display device of claim 1, wherein each of the plurality of pixel electrodes includes tungsten (W), copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

5. The display device of claim 1, wherein the first insulating layer is an inorganic layer.

6. The display device of claim 1, further comprising:

wavelength conversion layers, each disposed on each of the plurality of light emitting elements; and a bank filling a space between the plurality of light emitting elements and a space between the wavelength conversion layers.

7. The display device of claim 6, further comprising:

a second insulating layer disposed on side surfaces of the plurality of light emitting elements, side surfaces of the connection electrodes, and the first insulating layer on which the plurality of light emitting elements are not disposed; and a common electrode disposed on upper surfaces of the plurality of light emitting elements and the second insulating layer.

8. The display device of claim 7, further comprising:

a first reflective layer disposed on the side surfaces of the plurality of light emitting elements and the second insulating layer; and a second reflective layer disposed on side surfaces of the wavelength conversion layers.

9. The display device of claim 8, wherein a length of each of the wavelength conversion layers in a direction perpendicular to a thickness direction of the substrate is greater than a length of each of the plurality of light emitting elements in the direction perpendicular to the thickness direction, and the display device further comprises a third reflective layer disposed on bottom portions of the wavelength conversion layers not overlapping the plurality of light emitting elements.

10. The display device of claim 6, further comprising:

a light blocking member disposed on the bank; and color filters, each disposed on each of the wavelength conversion layers.

11. The display device of claim 1, wherein each of the plurality of pixel electrodes further comprises a lower electrode layer and an upper electrode layer disposed on the lower electrode layer.

12. The display device of claim 11, wherein the lower electrode layer includes a metal oxide, and the upper electrode layer includes a metal.

13. The display device of claim 11, wherein the upper electrode layer includes tungsten (W), copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

14. The display device of claim 1, wherein each of the plurality of light emitting elements comprises a first semiconductor layer, an electron blocking layer, an active layer, a superlattice layer, and a second semiconductor layer sequentially stacked on the plurality of pixel electrodes.

* * * * *